US011217533B2

(12) United States Patent
Soss et al.

(10) Patent No.: US 11,217,533 B2
(45) Date of Patent: Jan. 4, 2022

(54) SEMICONDUCTOR DEVICE WITH METAL STRUCTURE UNDER AN ACTIVE LAYER

(71) Applicant: GLOBALFOUNDRIES U.S. INC., Santa Clara, CA (US)

(72) Inventors: Steven Robert Soss, Saratoga Springs, NY (US); Steven John Bentley, Menands, NY (US); Julien Frougier, Albany, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 84 days.

(21) Appl. No.: 16/784,256

(22) Filed: Feb. 7, 2020

(65) Prior Publication Data

US 2021/0249352 A1     Aug. 12, 2021

(51) Int. Cl.
| | |
|---|---|
| H01L 23/522 | (2006.01) |
| H01L 29/78 | (2006.01) |
| H01L 23/535 | (2006.01) |
| H01L 27/088 | (2006.01) |
| H01L 21/8234 | (2006.01) |

(52) U.S. Cl.
CPC .... *H01L 23/535* (2013.01); *H01L 21/823431* (2013.01); *H01L 21/823475* (2013.01); *H01L 21/823481* (2013.01); *H01L 27/0886* (2013.01)

(58) Field of Classification Search
None
See application file for complete search history.

(56) References Cited

U.S. PATENT DOCUMENTS

| | | | |
|---|---|---|---|
| 9,570,395 B1 | 2/2017 | Sengupta et al. | |
| 2018/0145030 A1 | 5/2018 | Beyne et al. | |
| 2018/0233500 A1* | 8/2018 | Cheng | H01L 29/42392 |
| 2018/0261540 A1* | 9/2018 | Lee | H01L 29/785 |
| 2018/0374791 A1 | 12/2018 | Smith et al. | |

FOREIGN PATENT DOCUMENTS

WO     2019009871     1/2019

* cited by examiner

*Primary Examiner* — Joseph C. Nicely
*Assistant Examiner* — Lamont B Koo
(74) *Attorney, Agent, or Firm* — David Cain

(57) ABSTRACT

A semiconductor device is provided, the semiconductor device comprising a substrate and a first semiconductor fin and a second semiconductor fin disposed over the substrate. The first and second semiconductor fins each having an upper portion and a width. Epitaxial structures are disposed over the upper portions of the first and second semiconductor fins. The upper portions of the first and second semiconductor fins and the epitaxial structures provide an active layer. A metal structure is positioned between the active layer and the substrate. The metal structure extends at least across the widths of the first and second semiconductor fins and a separation distance between the fins. A first isolation material separates the metal structure from the active layer. A second isolation material separates the metal structure from the substrate. A contact electrically connects the metal structure to the epitaxial structures.

20 Claims, 19 Drawing Sheets

SEMICONDUCTOR DEVICE WITH METAL STRUCTURE UNDER AN ACTIVE LAYER

FIELD OF THE INVENTION

The disclosed embodiments relate generally to semiconductor devices, and more particularly, to semiconductor devices with metal structures under active device layers and the manufacture thereof.

BACKGROUND

When forming a device including a plurality of semiconductor devices, such as integrated circuits, standard logic cells may be used as a base unit for designing and manufacturing the integrated circuits. The standard logic cells may be used to form one or more functional circuits, therefore reducing design and manufacture costs.

During a typical operation, each standard logic cell requires power input (Vdd) and ground (Vss) connections. To power the various components, each standard logic cell is generally coupled to a power rail which is electrically connected to an active layer of the standard logic cell to provide the power (Vdd). In some instances, a plurality of power rails may be provided for each standard logic cell to provide the power (Vdd) and ground (Vss).

Since the power rails need to supply power to a number of standard logic cells, the power rails are often implemented with much larger sizes (e.g., larger width) compared to standard routing tracks or signal lines that are used within the cells. Typically, the size difference of the power rail compared to a normal routing line can be as large as three to four times, thus the power rails may utilize a substantial area within a cell. Hence, power rails may be fabricated in back-end of line (BEOL) metal layers. The large dimensions of the power rails lead to a reduction in the area that may be utilized for standard routing tracks or signal lines.

Hence, there is an urgent need to overcome the challenges mentioned above.

SUMMARY

In an aspect of the present disclosure, a semiconductor device is provided. The semiconductor device comprises a substrate and a first semiconductor fin and a second semiconductor fin disposed over the substrate, the first and second semiconductor fins each having an upper portion and a width. Epitaxial structures are disposed over the upper portions of the first and second semiconductor fins. The upper portions of the first and second semiconductor fins and the epitaxial structures provide an active layer. A metal structure is positioned between the active layer and the substrate. The metal structure extends at least across the widths of the first and second semiconductor fins and a separation distance between the fins. A first isolation material separates the metal structure from the active layer. A second isolation material separates the metal structure from the substrate. A first contact electrically connects the metal structure to the epitaxial structures.

In another aspect of the present disclosure, a semiconductor device is provided. The semiconductor device comprises a substrate and a first semiconductor fin and a second semiconductor fin disposed over the substrate, the first and second semiconductor fins each having an upper portion and a width. Epitaxial structures are disposed over the upper portions of the first and second semiconductor fins. The upper portions of the first and second semiconductor fins and the epitaxial structures provide an active layer. The active layer has a length and a width. A metal structure is positioned between the active layer and the substrate, having a length and a width. The metal structure extends at least across the widths of the first and second semiconductor fins and a separation distance between the fins. The length of the metal structure is at least equal to the length of the active layer. The width of the metal structure is at least equal to the width of the active layer. A first isolation material separates the metal structure from the active layer. A second isolation material separates the metal structure from the substrate. A contact electrically connects the metal structure to the epitaxial structures.

In yet another aspect of the present disclosure, a method of fabricating a semiconductor device is provided. The method comprises providing a substrate with a first semiconductor fin and a second semiconductor fin over the substrate. A cavity is formed in lower portions of the fins. A first isolation material is formed on a top surface of the cavity. A second isolation material is formed over the substrate. A metal structure is formed over the second isolation material and between the first and second isolation materials. Epitaxial structures are formed on the semiconductor fins. A contact is formed to electrically connect the epitaxial structures to the metal structure.

Numerous advantages may be derived from the embodiments described below. The metal structure may be used as a power or ground rail, signal routing line or to provide substrate bias. As the metal structure is positioned beneath the active device layer, it is not constrained by distance between adjacent fins or fin dimensions. Signal routing density is improved as the metal structure is not positioned in the BEOL metal layers, thus allowing for smaller standard logic cell size. Inserting the metal structure between upper portions of the semiconductor fins and the substrate leads to shorter semiconductor device height.

BRIEF DESCRIPTION OF THE DRAWINGS

The disclosed embodiments will be better understood from a reading of the following detailed description, taken in conjunction with the accompanying drawings.

Figure 1:
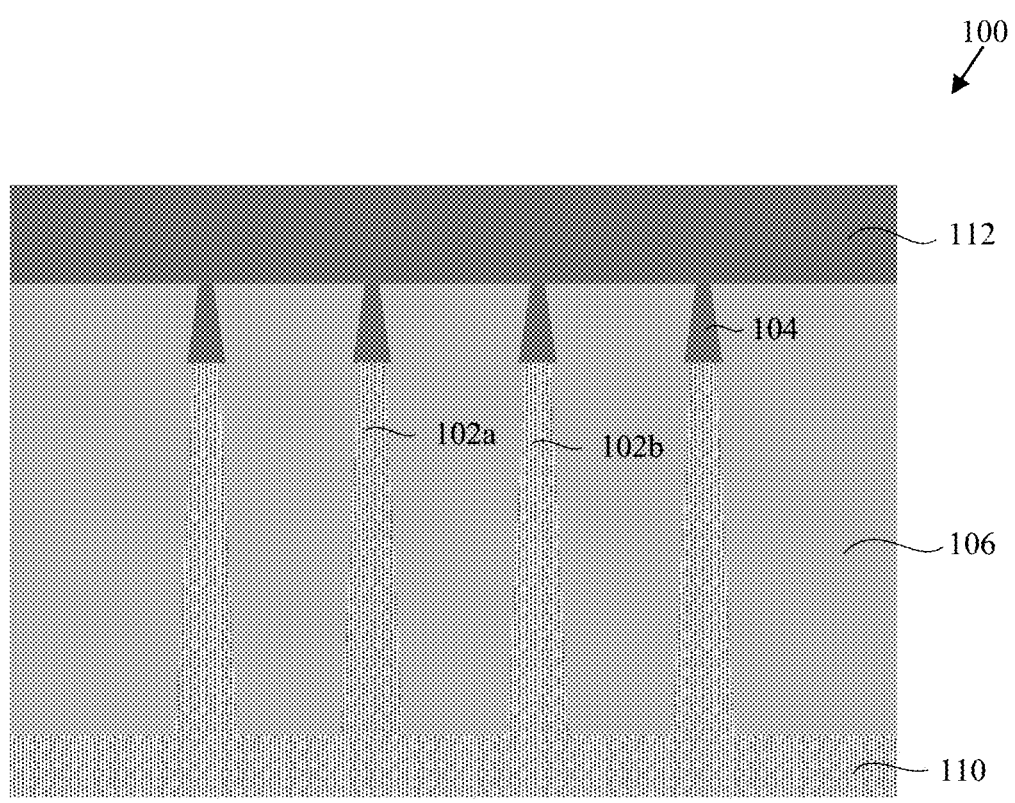
FIG. 1 is a cross-section view of a partially completed semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

FIGS. 1 to 4B illustrate a process flow to form a cavity over the substrate for subsequent deposition of a metal structure. The substrate may be a bulk semiconductor substrate.

FIG. 1 is a cross-section view of a partially completed semiconductor device 100 according to an embodiment of the disclosure. Referring to FIG. 1, the semiconductor device 100 comprises a first semiconductor fin 102a and a second semiconductor fin 102b disposed over a substrate 110, and the fins 102a and 102b are separated by a first dielectric material 106. Top surfaces of the fins 102a and 102b may be covered by protective nitride caps 104. In an embodiment, the first dielectric material 106 may be shallow trench isolation (STI). The first dielectric material 106 may be made of silicon dioxide. A nitride layer 112 may be deposited over the first dielectric material 106 and the protective nitride caps 104.

The first dielectric material 106 may be deposited over the substrate 110 and the semiconductor fins 102a and 102b by chemical vapor deposition (CVD) or physical vapor deposition (PVD). Although not shown, the first dielectric material 106 may be deposited over top surfaces of the semiconductor fins 102a and 102b. A planarization process such as chemical mechanical planarization (CMP) may be used to remove portions of the first dielectric material 106 from the top surfaces of the semiconductor fins 102a and 102b. The nitride layer 112 may be deposited over the first dielectric material 106 and the nitride caps 104 by CVD, PVD or atomic layer deposition (ALD).

The fins 102a and 102b generally define active regions for forming source and drain regions and channel regions underneath gate structures for the semiconductor device 100. While the fins 102a and 102b define active regions for the semiconductor device 100 in the present disclosure, it should be noted that the fin 102a or 102b is used only as a non-limiting example of an active region. Other active regions (e.g., a doped layer on a top surface of a bulk semiconductor substrate or a semiconductor-on-insulator (SOI) layer, etc.) may be used for different types of transistor devices In accordance with the embodiment in FIG. 1, the substrate 110 may include any appropriate semiconductor material, such as silicon, silicon germanium, silicon carbon, other II-VI or III-V semiconductor compounds and the like. In an embodiment, the semiconductor material of the substrate 110 may be silicon.

Figure 2A:
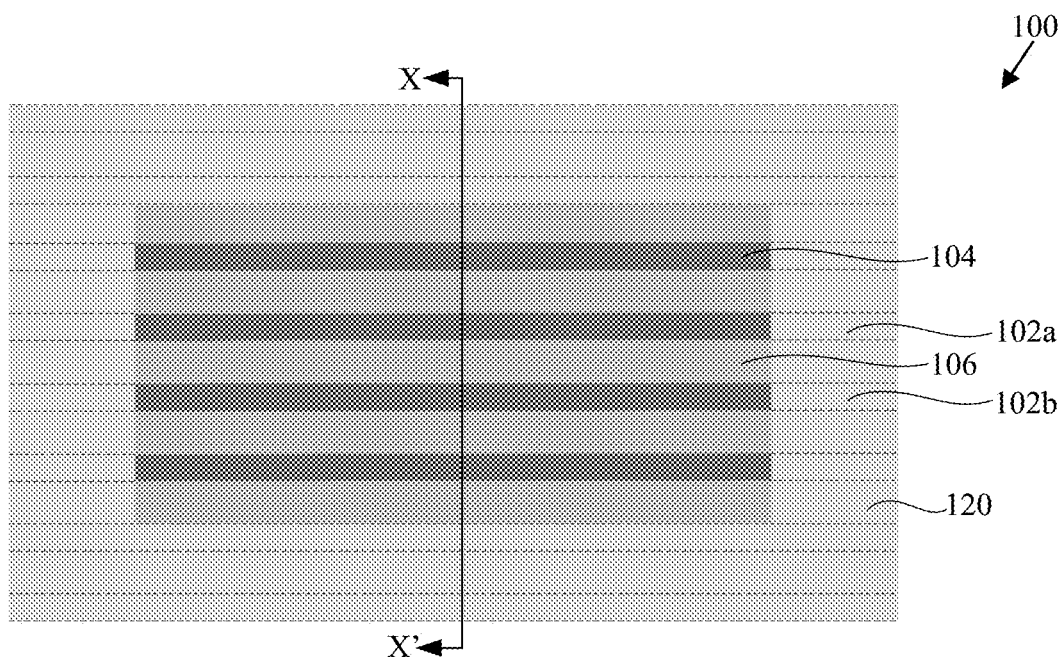
FIG. 2A is a top view of the partially completed semiconductor device after formation of a bottom isolation mask layer and removal of a portion of a nitride layer, according to an embodiment of the disclosure.

FIG. 2A shows a top view of the partially completed semiconductor device 100 after formation of a bottom isolation mask layer 120 to cover a portion of the nitride layer 112 and removal of a portion of the nitride layer 112 that is not covered by the bottom isolation mask layer 120, according to an embodiment of the disclosure. Although not shown, the formation of the bottom isolation mask layer 120 may include depositing a layer of photoresist material on a top surface of the device 100, followed by conventional photoresist exposure and developing to form the required photoresist patterns. A wet etch or dry etch process may be used to remove portions of the nitride layer 112 that are not covered by the photoresist patterns. The bottom isolation mask layer 120 and the remaining nitride layer 112 protect portions of the semiconductor fins 102 from further processing. Portions of the semiconductor fins 102a and 102b covered by the bottom isolation mask layer 120 and the nitride layer 112 are shown as dashed outlines.

Figure 2B:
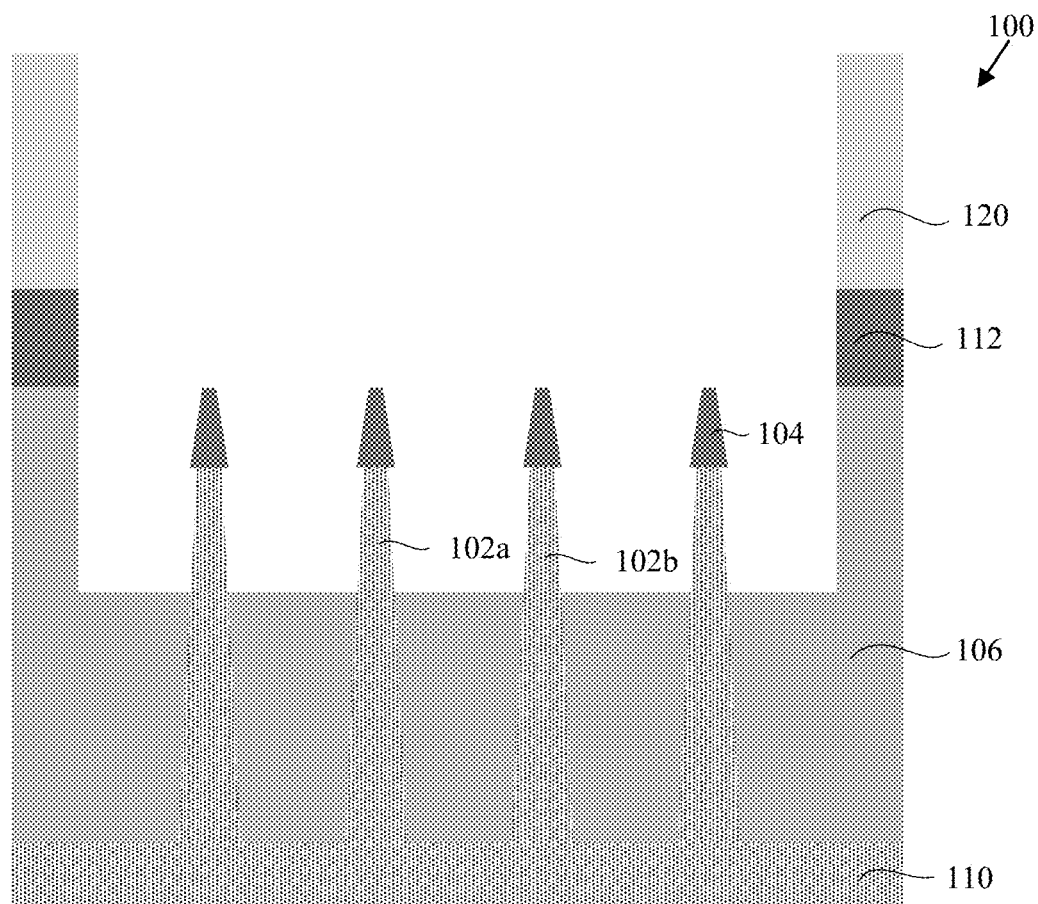
FIG. 2B is a cross-section view of the partially completed semiconductor device taken along section line X-X' of FIG. 2A, according to an embodiment of the disclosure.

FIG. 2B is a cross-section view of the partially completed semiconductor device 100 taken along section line X-X' of FIG. 2A, according to an embodiment of the disclosure. Referring to FIG. 2B, upper portions of the first dielectric material 106 that are not covered by the nitride layer 112 may be removed to expose upper portions of the semiconductor fins 102a and 102b, defining a height of the semiconductor fins 102a and 102b for an active layer.

Figure 3:
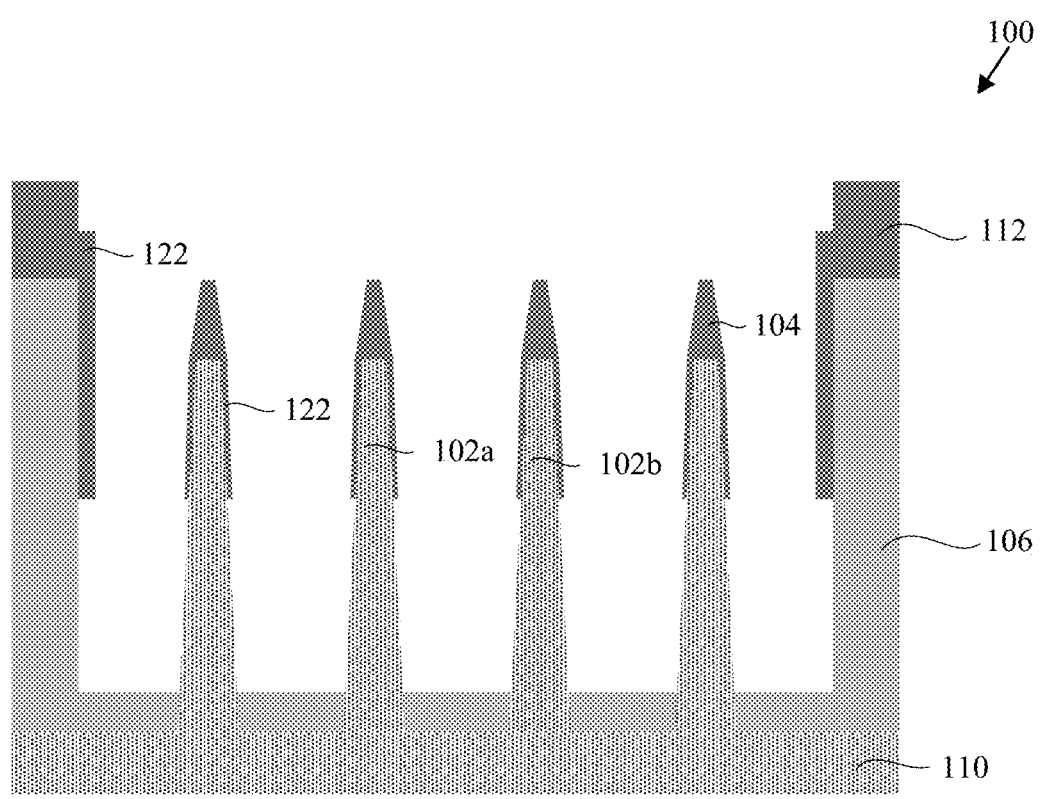
FIG. 3 is a cross-section view of the partially completed semiconductor device after removal of the bottom isolation mask layer, formation of spacer structures on upper portions of semiconductor fins and removal of a first dielectric material to expose lower portions of the semiconductor fins, according to an embodiment of the disclosure.

FIG. 3 is a cross-section view of the partially completed semiconductor device 100 after removal of the bottom isolation mask layer 120, formation of spacer structures 122 on the upper portions of the semiconductor fins 102a and 102b and removal of lower portions of the first dielectric material 106 to expose lower portions of the semiconductor fins 102a and 102b, according to an embodiment of the disclosure. The removal of the bottom isolation mask layer 120 may be by either wet etch or dry etch process. Spacer structures 122 may be formed by depositing a layer of dielectric material over the upper portions of the semiconductor fins 102a and 102b followed by anisotropic etching of the deposited dielectric material. In an embodiment, the dielectric material may be silicon nitride. The silicon nitride layer may be deposited by ALD, CVD, PVD or any other suitable deposition processes. In an embodiment, the thickness of the silicon nitride layer may be in the range of 1 to 2 nanometers. In an embodiment, the silicon nitride layer may also be deposited on upper portions of sidewalls of the first dielectric material 106. The anisotropic etching process may be a dry etch process.

The term "anisotropic etching" refers to etching which does not proceed in all directions at the same rate. If etching proceeds exclusively in one direction (e.g., only vertically), the etching process is said to be completely anisotropic.

The lower portions of the first dielectric material 106 may be removed by dry etch or wet etch process. Preferably, the removal of the first dielectric material 106 is by a dry etch process. In an embodiment, the removal of the first dielectric material 106 may expose the semiconductor substrate 110.

Figure 4A:
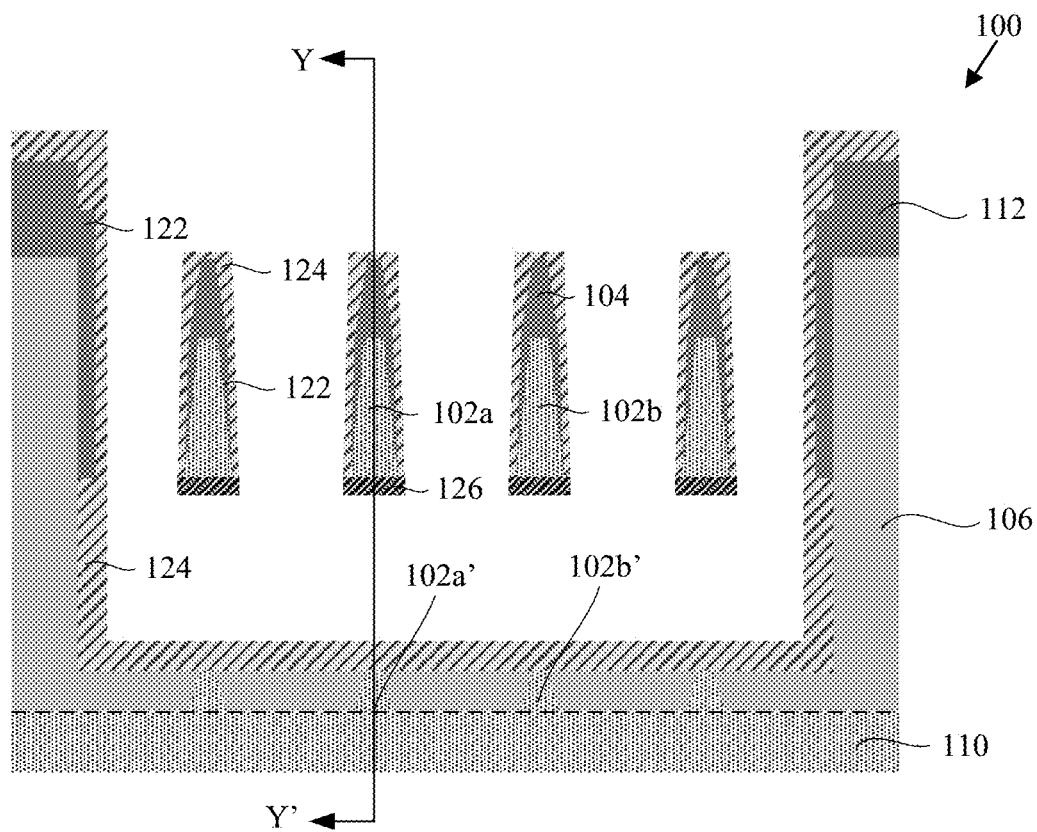
FIG. 4A is a cross-section view of the partially completed semiconductor device after removal of the lower portions of the semiconductor fins, formation of a first isolation material on bottom surfaces of the upper portions of the semiconductor fins and formation of a second isolation material over a substrate, according to an embodiment of the disclosure.

FIG. 4A is a cross-section view of the partially completed semiconductor device 100 after removal of the exposed lower portions of the semiconductor fins 102a and 102b, formation of a first isolation material 126 and formation of a second isolation material 124 over the substrate 110, according to an embodiment of the disclosure. The removal of the exposed lower portions of the semiconductor fins 102a and 102b forms a cavity in the lower portions of the semiconductor fins 102a and 102b. In an embodiment, the removal process leaves behind base portions of the semiconductor fins, 102a' and 102b', respectively, on an upper surface of the substrate 110. A dashed line delineates the base portions of the semiconductor fins 102a' and 102b' from the substrate 110. The removal process may be by isotropic etching. The term "isotropic etching" refers to an etching process where etching can proceed in all directions at once, with roughly the same etch rate.

The formation of a first isolation material 126 on a top surface of the cavity may include growing an oxide layer by in-situ steam generation process. In an embodiment, the oxide layer is a silicon dioxide layer. The formation of a second isolation material 124 over the substrate 110, base portions of the semiconductor fins 102a' and 102b' on the substrate, spacer structures 122 and protective nitride caps 104 on upper portions of the semiconductor fins 102a and 102b may include depositing an oxide liner by ALD, CVD, PVD or any other suitable deposition processes. The oxide liner may be silicon dioxide, hafnium dioxide or carbon-doped silicon oxide, carbon-doped silicon nitride, silicon-boron-carbon-nitride, or other electrically insulating material. The thickness of the oxide liner is targeted to provide required insulation between the subsequent metal wire and the semiconductor device 100. In one embodiment, the thickness range of the oxide liner may be between 5 to 8 nanometers. The second isolation material 124 may also be deposited on upper surfaces of the nitride layer 112 and lower portions of the sidewalls of the first dielectric material 106.

Figure 4B:
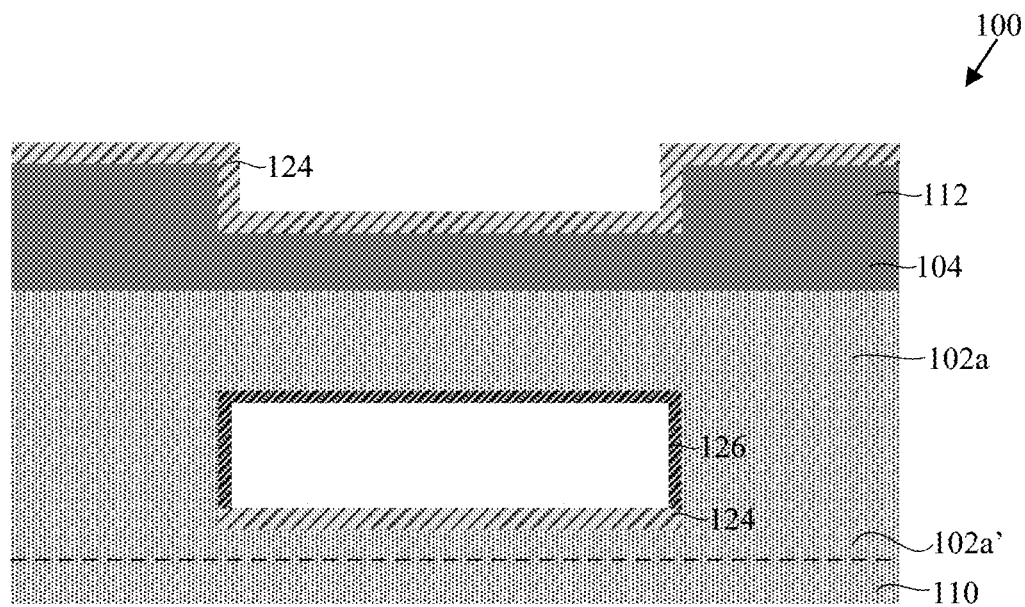
FIG. 4B is a cross-section view of the partially completed semiconductor device taken along section line Y-Y' of FIG. 4A, according to an embodiment of the disclosure.

FIG. 4B is a cross-section view of the partially completed semiconductor device 100 taken along section line Y-Y' of FIG. 4A, according to an embodiment of the disclosure. The first isolation material 126 may be formed on sidewalls of the cavity. Portions of the semiconductor fins 102a and 102b covered by the nitride layer 112 are protected from the removal process.

Figure 5:
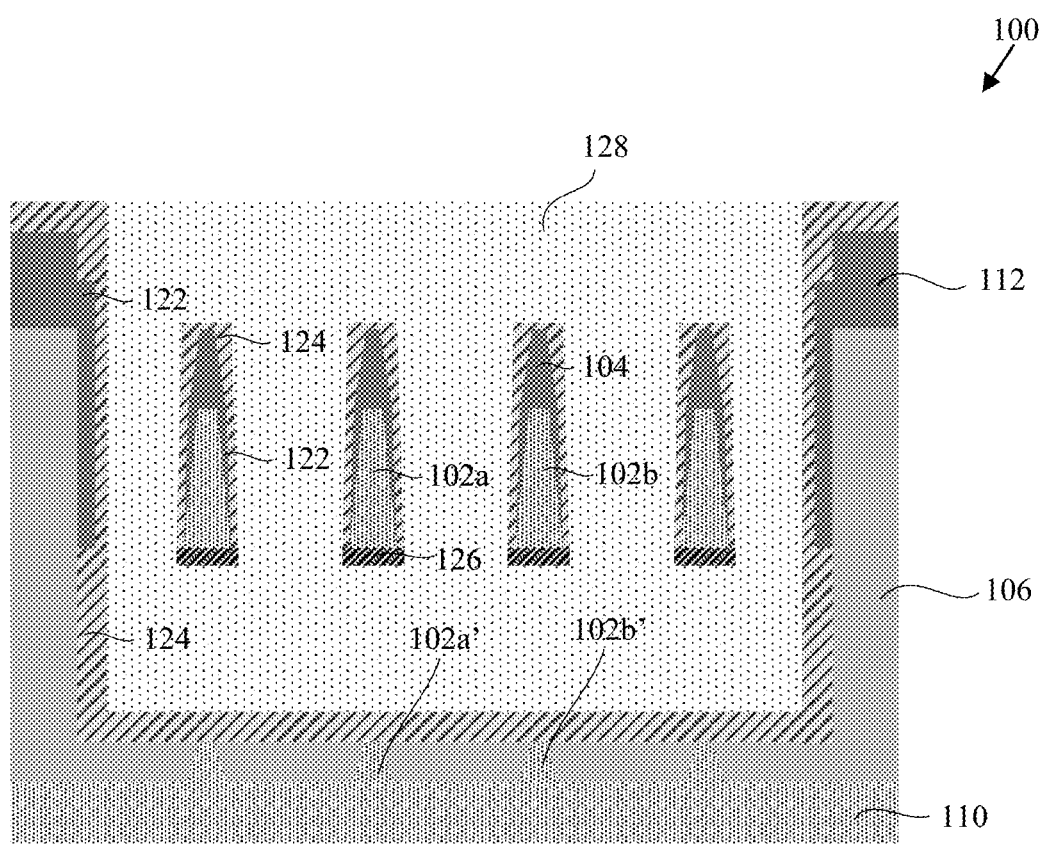
FIG. 5 is a cross-section view of the partially completed semiconductor device after deposition of a metal layer over the second isolation material, between the first and second isolation materials and over the upper portions of the semiconductor fins, according to an embodiment of the disclosure.

FIG. 5 is a cross-section view of the partially completed semiconductor device 100 after deposition of a metal layer 128 over the second isolation material 124, the upper portions of the semiconductor fins 102a and 102b and between the first and second isolation materials, 126 and 124, respectively, according to an embodiment of the disclosure. The metal layer 128 may be deposited by ALD, CVD, PVD, electroplating or any suitable deposition processes. The metal layer 128 may be made of, but is not limited to, tungsten (W), ruthenium (Ru), titanium (Ti), or titanium nitride (TiN). The metal utilized for layer 128 should have thermal stability required to process through the semiconductor processing operations. Although not shown, the metal layer 128 may be deposited over upper surfaces of the second isolation material 124. A planarization process such as CMP may be used to remove the metal layer 128 from the upper surfaces of the second isolation material 124.

Figure 6A:
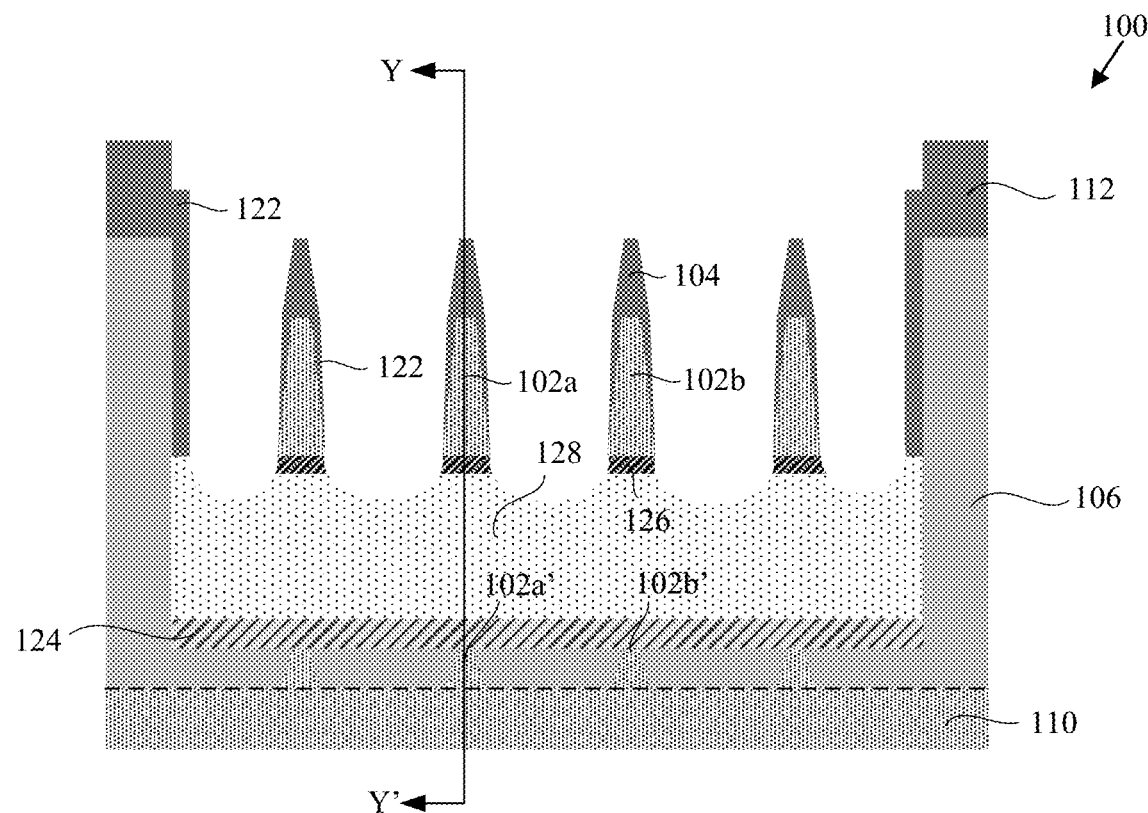
FIG. 6A is a cross-section view of the partially completed semiconductor device after removal of the metal layer from the upper portions of the semiconductor fins to form a metal structure over the second isolation material and between the first and second isolation materials, according to an embodiment of the disclosure.

FIG. 6A is a cross-section view of the partially completed semiconductor device 100 after removal of the metal layer 128 from the upper portions of the semiconductor fins 102a and 102b to form a metal structure 128 over the second isolation material 124 and between the first and second isolation materials, 126 and 124, respectively, according to an embodiment of the disclosure. The removal of the metal layer 128 may be by wet etch or dry etch process. The second isolation material 124, the protective nitride caps 104 and the spacer structures 122 protect the upper portions of the semiconductor fins 102a and 102b from the etching process. After the formation of the metal structure 128, the second isolation material 124 may be removed from the spacer structures 122 and the protective nitride caps 104.

Figure 6B:
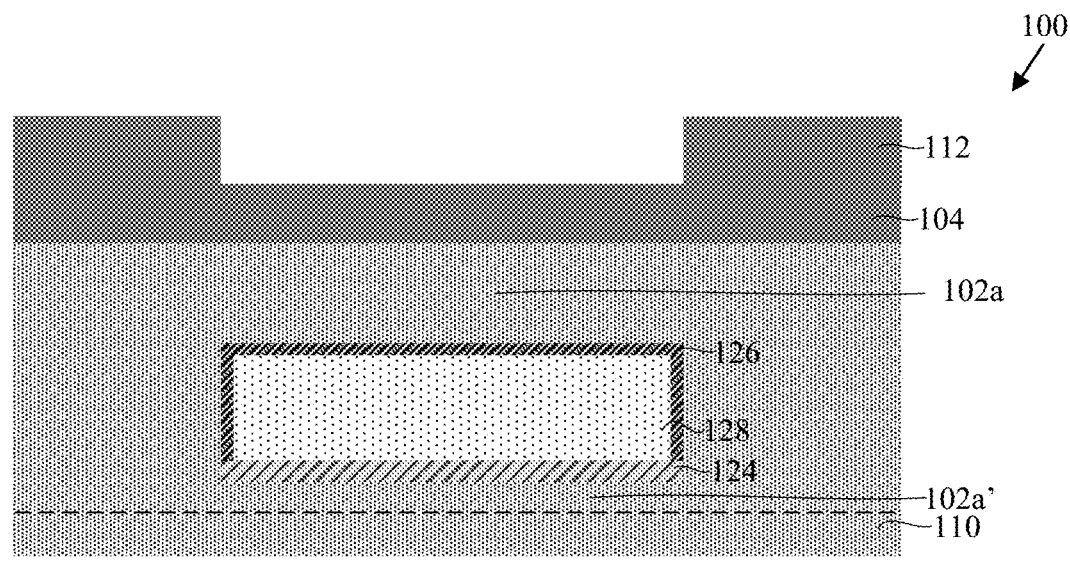
FIG. 6B is a cross-section view of the partially completed semiconductor device taken along section line Y-Y' of FIG. 6A, according to an embodiment of the disclosure.

FIG. 6B is a cross-section view of the partially completed semiconductor device 100 taken along section line Y-Y' of FIG. 6A, according to an embodiment of the disclosure. The metal layer 128 fills up the cavity in the lower portions of the semiconductor fins 102a and 102b. In some embodiments, the cavity may be partially or fully filled.

Figure 6C:
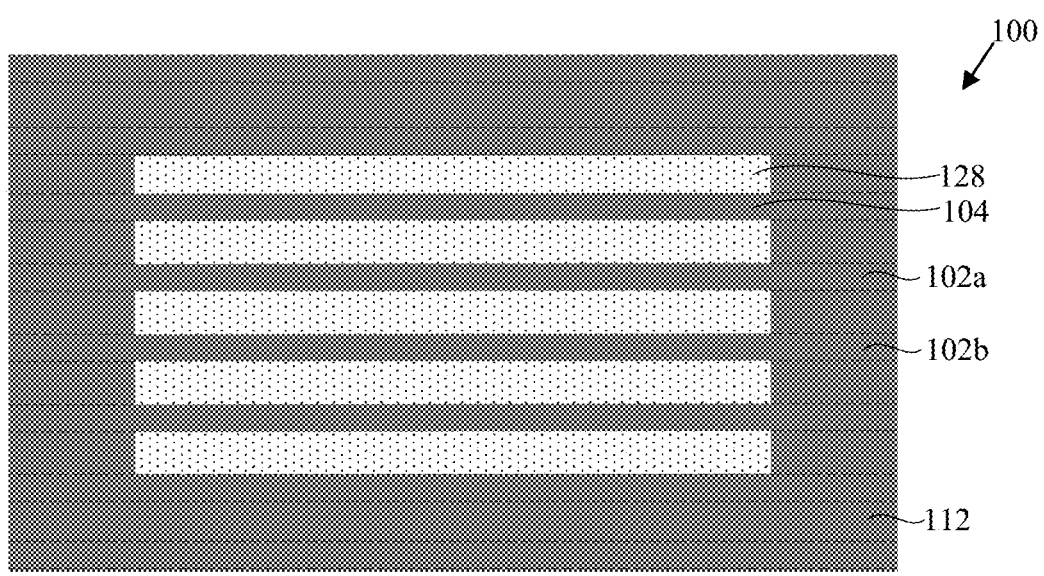
FIG. 6C is a corresponding top view of the partially completed semiconductor device shown in FIGS. 6A and 6B, according to an embodiment of the disclosure.

FIG. 6C is a corresponding top view of the partially completed semiconductor device 100 shown in FIGS. 6A and 6B, according to an embodiment of the disclosure. Portions of the semiconductor fins 102a and 102b underneath the nitride layer 112 are shown as dashed outlines. The metal structure 128 is formed over a portion of the substrate 110 that is not covered by the nitride layer 112.

Figure 7A:
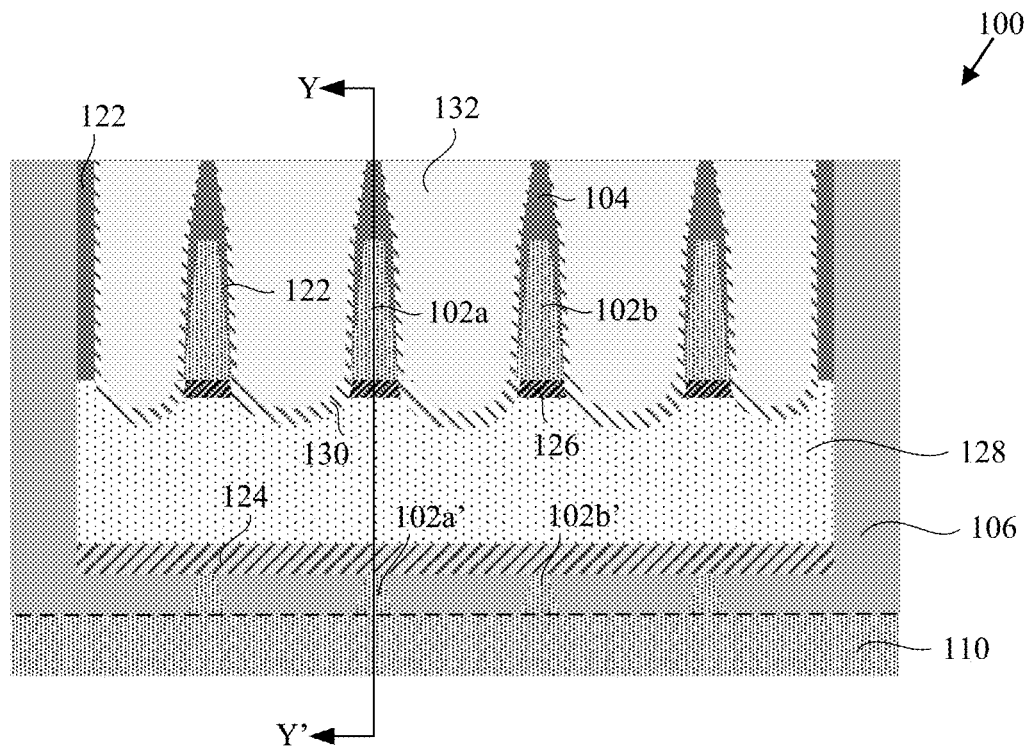
FIG. 7A is a cross-section view of the partially completed semiconductor device after deposition of a dielectric liner over the upper portions of the semiconductor fins and over the metal structure, formation of a second dielectric material over the dielectric liner and removal of the nitride layer according to an embodiment of the disclosure.

FIG. 7A is a cross-section view of the partially completed semiconductor device 100 after deposition of a dielectric liner 130 over the upper portions of the semiconductor fins 102a and 102b and the metal structure 128, formation of a second dielectric material 132 over the dielectric liner 130 and removal of the nitride layer 112 from the first dielectric material 106 to expose the first dielectric material 106, according to an embodiment of the disclosure. The dielectric liner 130 and the second dielectric material 132 may be deposited by ALD, CVD, PVD or any other suitable deposition processes. In an embodiment, the dielectric liner 130 may be made of silicon nitride. In an embodiment, the second dielectric material 132 may be made of silicon dioxide. Although not shown, the dielectric liner 130 and the second dielectric material 132 may be deposited over upper surfaces of the nitride layer 112. A planarization process such as CMP may be used to remove the dielectric liner 130 and the second dielectric material 132 from the upper surfaces of the nitride layer 112 and the nitride layer 112 from upper surfaces of the first dielectric material 106. The planarization process may also remove the dielectric liner 130 from top surfaces of the semiconductor fins 102a and 102b.

Figure 7B:
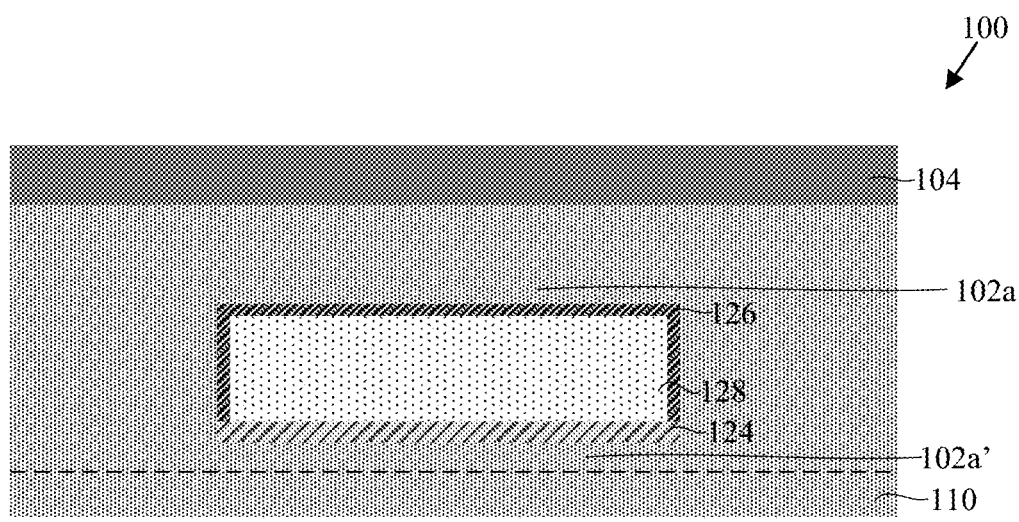
FIG. 7B is a cross-section view of the partially completed semiconductor device taken along section line Y-Y' of FIG. 7A, according to an embodiment of the disclosure.

FIG. 7B is a cross-section view of the partially completed semiconductor device 100 taken along section line Y-Y' of FIG. 7A, according to an embodiment of the disclosure. Referring to FIG. 7B, the nitride layer 112 may also be removed from portions of the semiconductor fins 102 to expose the protective nitride caps 104.

Figure 8A:
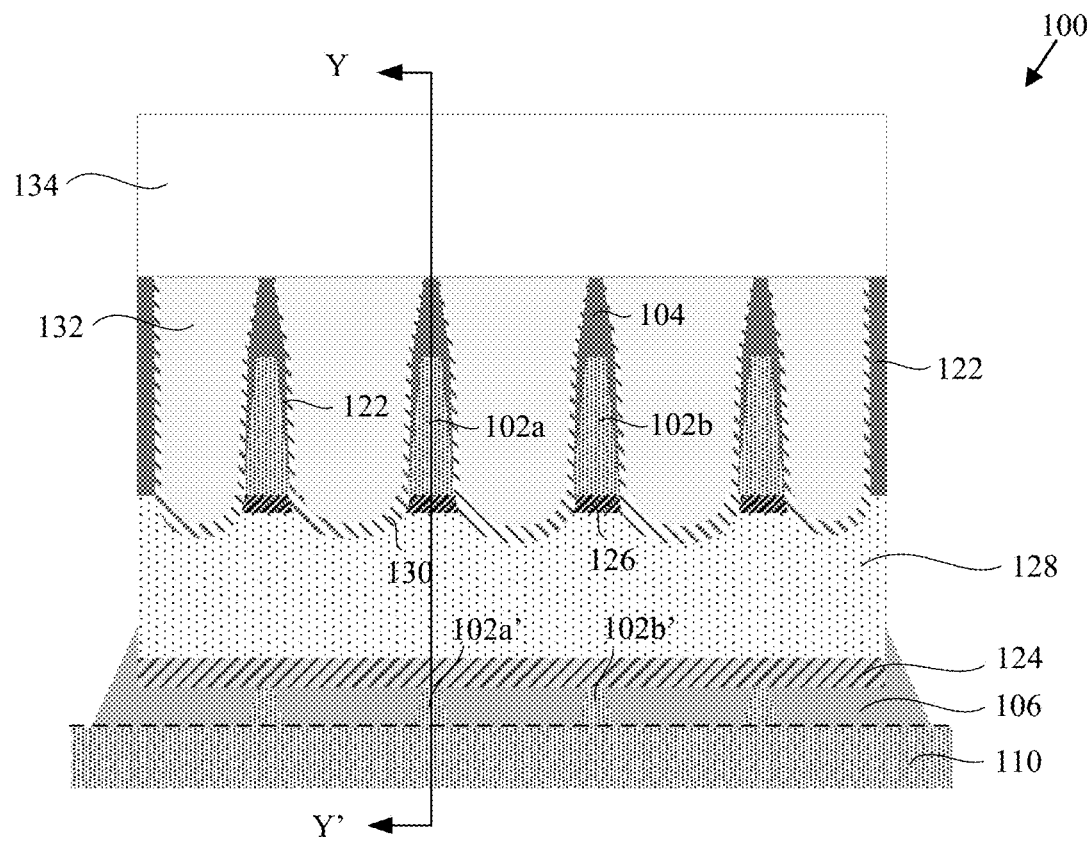
FIG. 8A is a cross-section view of the partially completed semiconductor device after formation of an active region mask and removal of portions of the first dielectric material that are not covered by the mask, according to an embodiment of the disclosure.

FIG. 8A is a cross-section view of the partially completed semiconductor device 100 after formation of an active region mask 134 over the upper portions of the semiconductor fins 102a and 102b, over the metal structure 128 and over the second dielectric material 132 and removal of portions of the first dielectric material 106 that are not covered by the active region mask 134, according to an embodiment of the disclosure. Although not shown, the formation of the active region mask 134 may include depositing a layer of photoresist material on a top surface of the semiconductor device 100, followed by conventional photoresist exposure and developing to form the required photoresist patterns. A wet etch or dry etch process may be used to remove portions of the first dielectric material 106 that are not covered by the photoresist patterns.

Figure 8B:
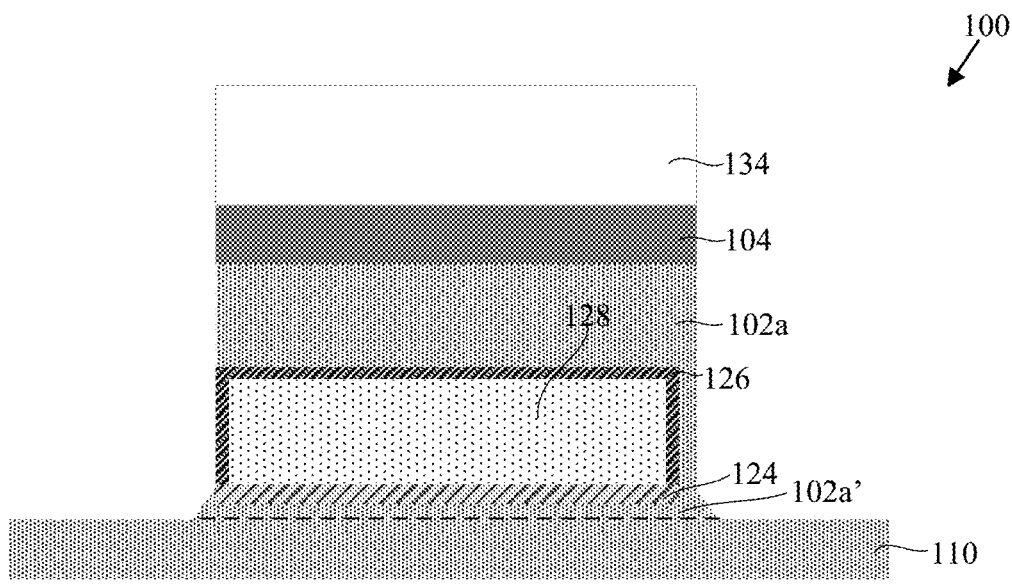
FIG. 8B is a cross-section view of the partially completed semiconductor device taken along section line Y-Y' of FIG. 8A, according to an embodiment of the disclosure.

FIG. 8B is a cross-section view of the partially completed semiconductor device 100 taken along section line Y-Y' of FIG. 8A, according to an embodiment of the disclosure. Referring to FIG. 8B, portions of the semiconductor fins 102a and 102b that are not covered by the active region mask 134 may be removed by wet etch or dry etch process to define an active layer. The semiconductor fins 102a and 102b may extend over the metal structure 128. The metal structure 128 may have sidewalls. A portion of the sidewall of the metal structure 128 may be covered by a lower portion of the semiconductor fins 102a and 102b. The lower portion of the semiconductor fins 102a and 102b may be separated from the portion of the sidewall of the metal structure 128 by the first isolation material 126.

Figure 8C:
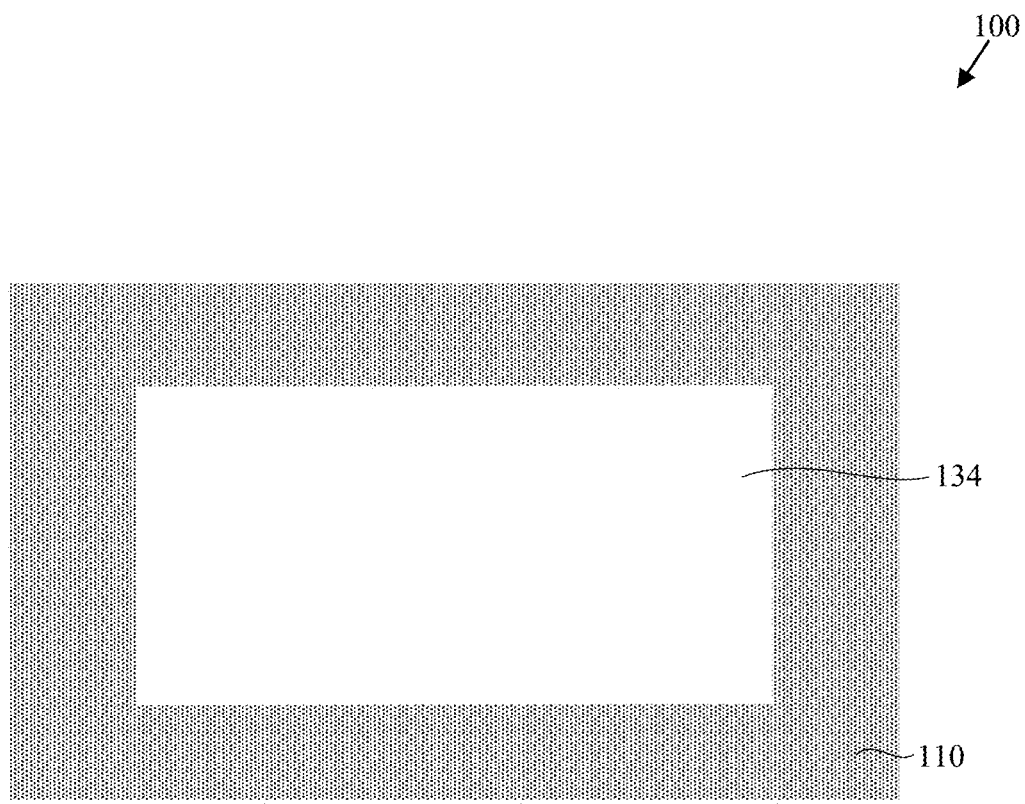
FIG. 8C is a corresponding top view of the partially completed semiconductor device shown in FIGS. 8A and 8B, according to an embodiment of the disclosure.

FIG. 8C is a corresponding top view of the partially completed semiconductor device 100 shown in FIGS. 8A and 8B, according to an embodiment of the disclosure. The active region mask 134 defines the active layer of the semiconductor device 100. Portions of the semiconductor fins 102a and 102b that are not covered by the active region mask 134 may be removed to expose the semiconductor substrate 110.

Figure 9A:
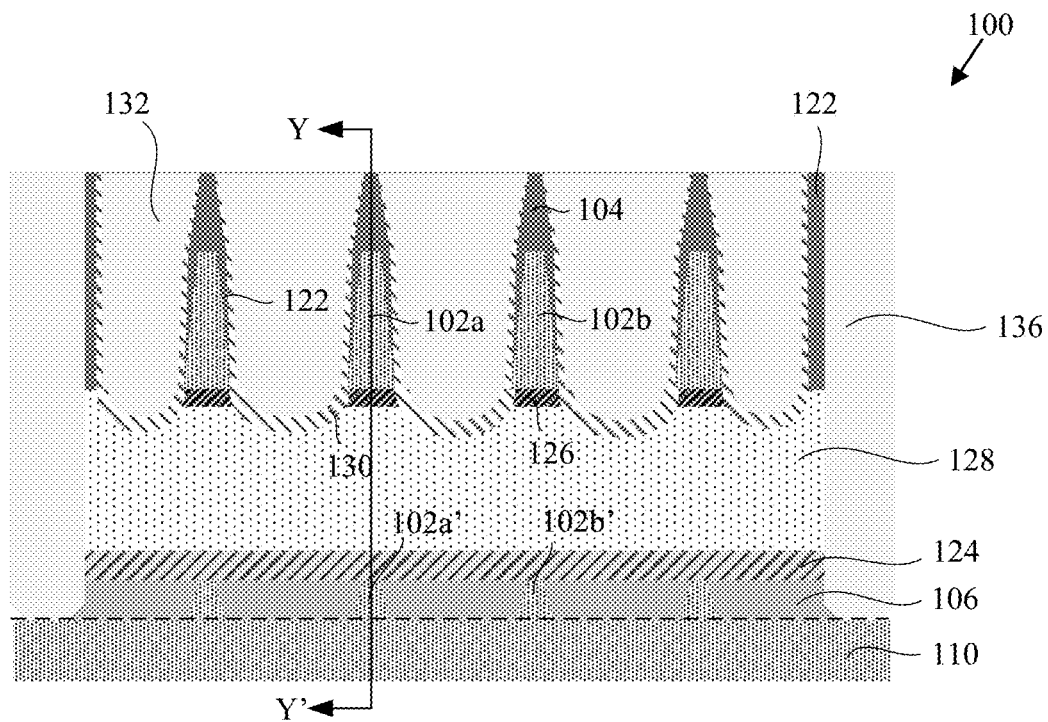
FIG. 9A is a cross-section view of the partially completed semiconductor device after removal of the active region mask, according to an embodiment of the disclosure.

FIG. 9A is a cross-section view of the partially completed semiconductor device 100 after removal of the active region mask 134 and formation of a third dielectric material 136 over the etched portions of the first dielectric material 106, according to an embodiment of the disclosure. The active region mask 134 may be removed by wet etch or dry etch process. The formation of the third dielectric material 136 may include depositing the third dielectric material 136 over the etched portions of the first dielectric material 106. Although not shown, the third dielectric material 136 may also be deposited over upper surfaces of the second dielectric material 132 and over upper portions of the semiconductor fins 102. The third dielectric material 136 may be deposited by CVD, PVD, ALD or any other suitable deposition processes. In an embodiment, the third dielectric material 136 may be made of silicon dioxide. In an embodiment, the third dielectric material 136 may be STI. A planarization process such as CMP may be used to remove portions of the third dielectric material 136 from the upper surfaces of the second dielectric material 132 and from the upper portions of the semiconductor fins 102a and 102b.

Figure 9B:
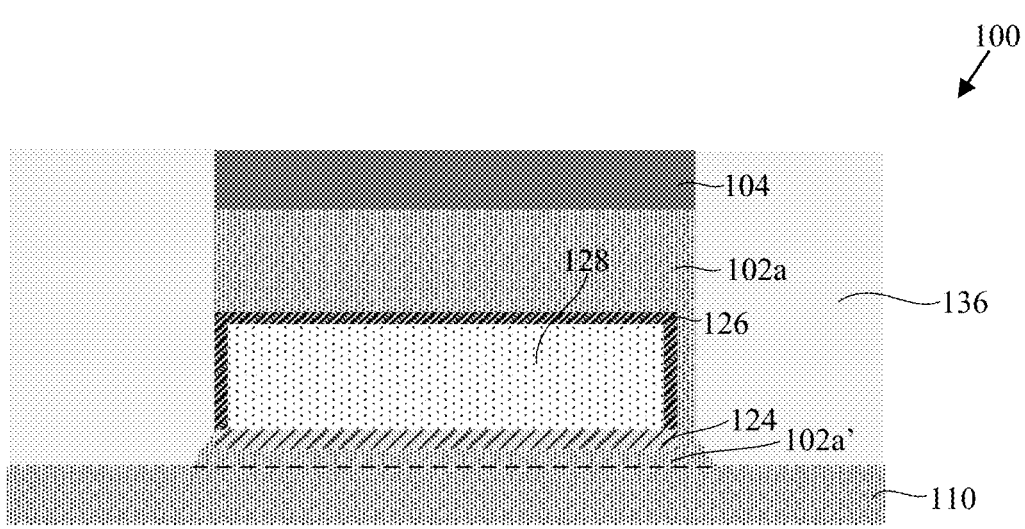
FIG. 9B is a cross-section view of the partially completed semiconductor device taken along section line Y-Y' of FIG. 9A, according to an embodiment of the disclosure.

FIG. 9B is a cross-section view of the partially completed semiconductor device 100 taken along section line Y-Y' of FIG. 9A, according to an embodiment of the disclosure. The third dielectric material 136 may also be deposited over the etched portions of the semiconductor fins 102a and 102b.

Figure 9C:
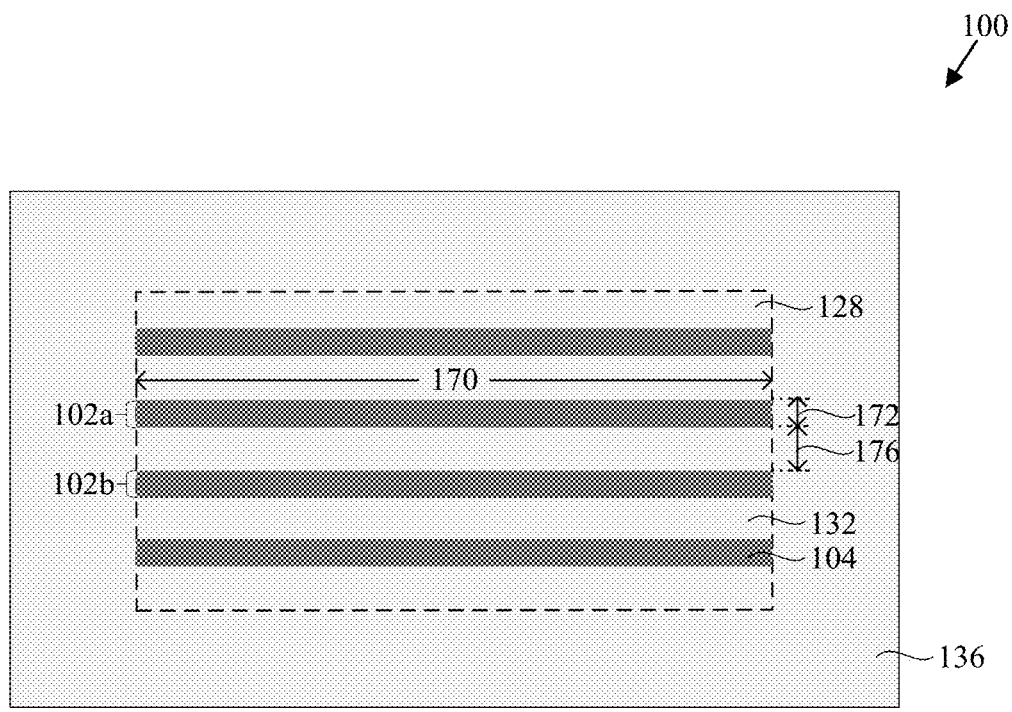
FIG. 9C is a corresponding top view of the partially completed semiconductor device shown in FIGS. 9A and 9B, according to an embodiment of the disclosure.

FIG. 9C is a corresponding top view of the partially completed semiconductor device 100 shown in FIGS. 9A and 9B, according to an embodiment of the disclosure. Referring to FIG. 9C, the first and the second semiconductor fins, 102a and 102b, respectively, have a length 170. The metal structure 128 extends at least across the length 170 of the semiconductor fins 102a and 102b. The first and the second semiconductor fins 102a and 102b have a width 172 and are separated by a separation distance 176. The metal structure 128 extends at least across the widths 172 of the fins 102a and 102b and the separation distance 176 between the fins 102a and 102b. The metal structure 128 under the active layer is depicted as a dashed outline. The metal structure 128 has a length and a width that are at least equal to or greater than the length and the width, respectively, of the active layer.

Figure 10:
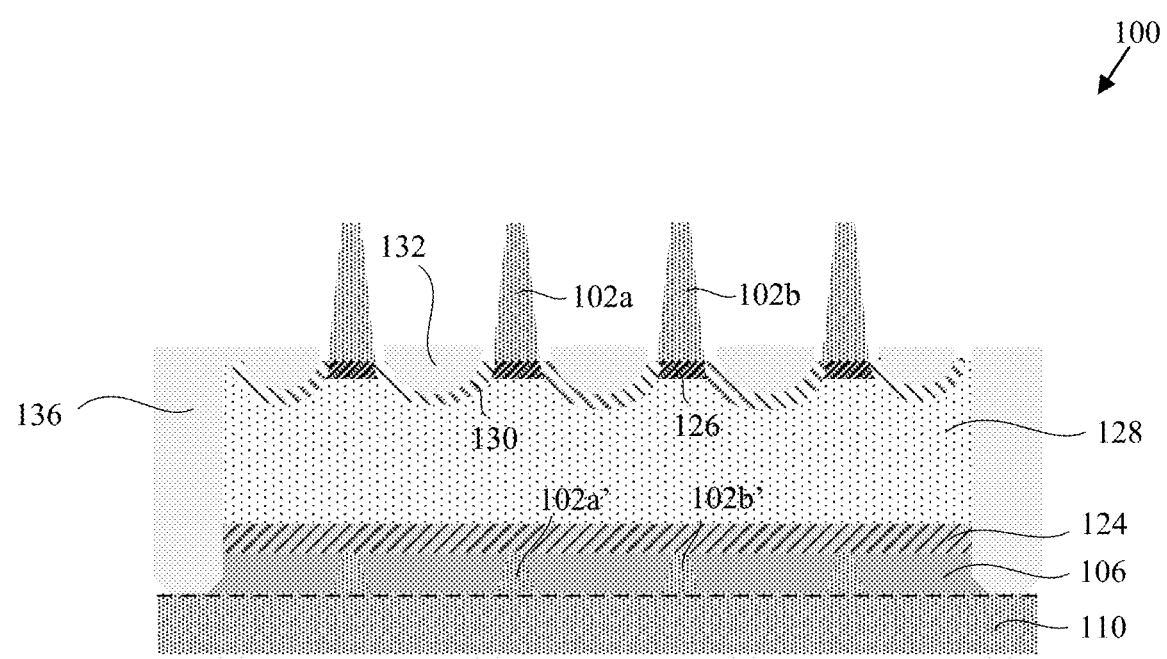
FIG. 10 is a cross-section view of the partially completed semiconductor device after removal of the second dielectric material from the upper portions of the semiconductor fins, removal of nitride caps from top surfaces of the semiconductor fins and removal of the dielectric spacers from the upper portions of the semiconductor fins, according to an embodiment of the disclosure.

FIG. 10 is a cross-section view of the partially completed semiconductor device 100 after removal of a portion of the second dielectric material 132 from the upper portions of the semiconductor fins 102a and 102b, removal of the protective nitride caps 104 from top surfaces of the semiconductor fins 102a and 102b, removal of the dielectric liner 130 from upper portions of the semiconductor fins 102a and 102b, removal of the dielectric spacers 122 from the upper portions of the semiconductor fins 102a and 102b and from sidewalls of the second dielectric material 132 and removal of upper portions of the third dielectric material 136, according to an embodiment of the disclosure. The removal of the second dielectric material 132, protective nitride caps 104, dielectric liner 130 and dielectric spacers 122 exposes the upper portions of the semiconductor fins 102a and 102b. In an embodiment, the second dielectric material 132, protective nitride caps 104, dielectric liner 130, dielectric spacers 122 and the third dielectric material 136 may be removed by wet etch or dry etch process.

Figure 11A:
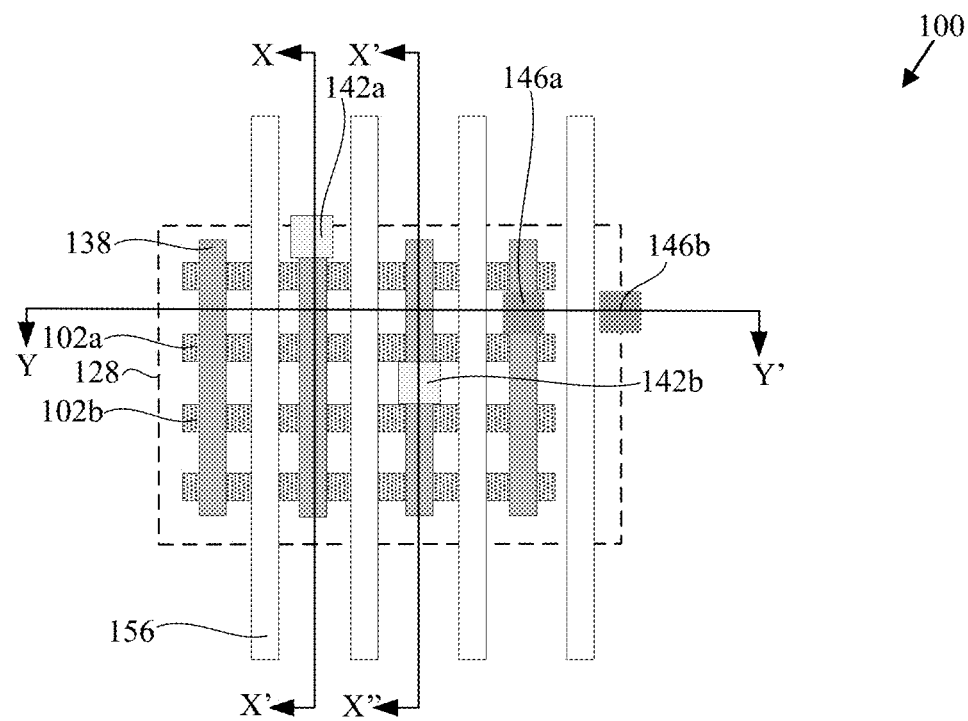
FIG. 11A is a top view of the semiconductor device after formation of gate structures over the semiconductor fins, epitaxial structures between the gate structures and contacts to the metal structure, according to an embodiment of the disclosure.

FIG. 11A is a top view of the semiconductor device 100 after formation of gate electrodes 156 over the semiconductor fins 102a and 102b, epitaxial structures 138 on the semiconductor fins 102a and 102b and contacts 142a, 142b, 146a and 146b to the metal structure 128, according to an embodiment of the disclosure. The metal structure 128 is depicted as a dashed outline. Referring to FIG. 11A, the gate electrodes 156 transverse the plurality of fins 102a and 102b.

Formation of the gate electrodes 156 may include depositing a layer of amorphous silicon over the plurality of fins 102a and 102b. A layer of photoresist material may be deposited over the amorphous silicon layer followed by conventional photoresist exposure and developing to form photoresist patterns that are consistent with prior art practices. A wet etch or dry etch process may be used to remove portions of the amorphous silicon that are not covered by the photoresist material is removed after the etching processes. Spacer structures may then be formed over the patterned amorphous silicon layer. The formation of the spacer structures may include depositing a layer of dielectric material over the patterned amorphous silicon layer followed by anisotropic etching of the dielectric material. Epitaxial structures 138 may be formed on exposed upper portions of the semiconductor fins 102a and 102b that are not covered by the patterned amorphous silicon layer and the spacer structures. The formation of the epitaxial structures 138 includes forming a cavity in the exposed upper portions of the fins 102a and 102b followed by growth of the epitaxial structures 138 in the fin cavity, consistent with prior art practices. A layer of interlayer dielectric (ILD) material may subsequently be deposited over the patterned amorphous silicon layer, the spacer structures and the epitaxial structures 138 followed by a planarization process such as CMP to remove the ILD material from upper surfaces of the patterned amorphous silicon layer and the spacer structures. The ILD material may be made of silicon dioxide and may be deposited by CVD or PVD. The patterned amorphous silicon layer may be removed by wet etch or dry etch process, exposing portions of the semiconductor fins 102a and 102b. Gate metal may be deposited over the exposed portions of the semiconductor fins 102a and 102b to form the gate electrodes 156.

Figure 11B:
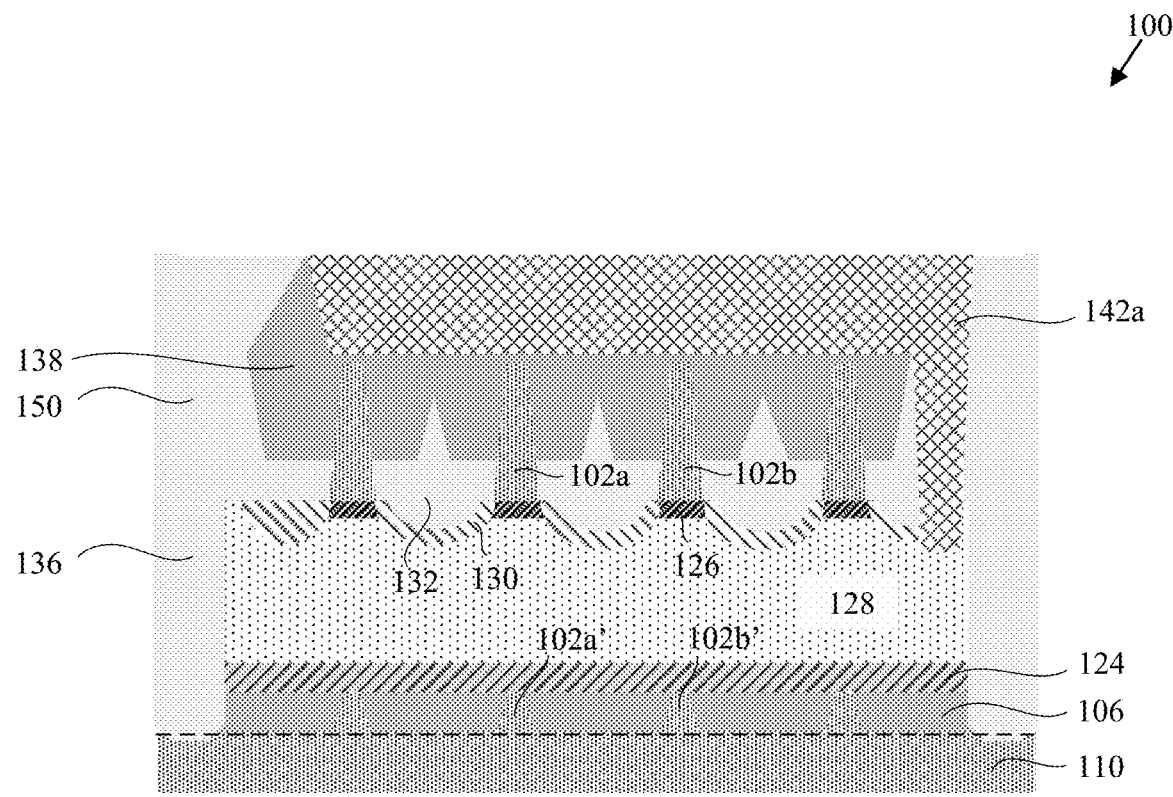
FIG. 11B is a cross-section view of the semiconductor device taken along section line X-X' of FIG. 11A, according to an embodiment of the disclosure.

FIG. 11B is a cross-section view of the semiconductor device 100 taken along section line X-X' of FIG. 11A, according to an embodiment of the disclosure. Referring to FIG. 11B, a contact 142a may be formed to electrically connect the metal structure 128 to the epitaxial structures 138. The formation of the contact 142a may include removing a portion of the ILD material 150, the second dielectric material 132 and the dielectric liner 130 to form an opening exposing a portion of the metal structure 128 and the epitaxial structures 138. A contact metal may subsequently be deposited into the opening. The removal of the ILD material 150, the second dielectric material 132 and the dielectric liner 130 may be by wet etch or dry etch process. The contact metal may be deposited by ALD, CVD, PVD, electroplating or any other suitable deposition processes. In an embodiment, the contact metal may be W or cobalt (Co).

Figure 11C:
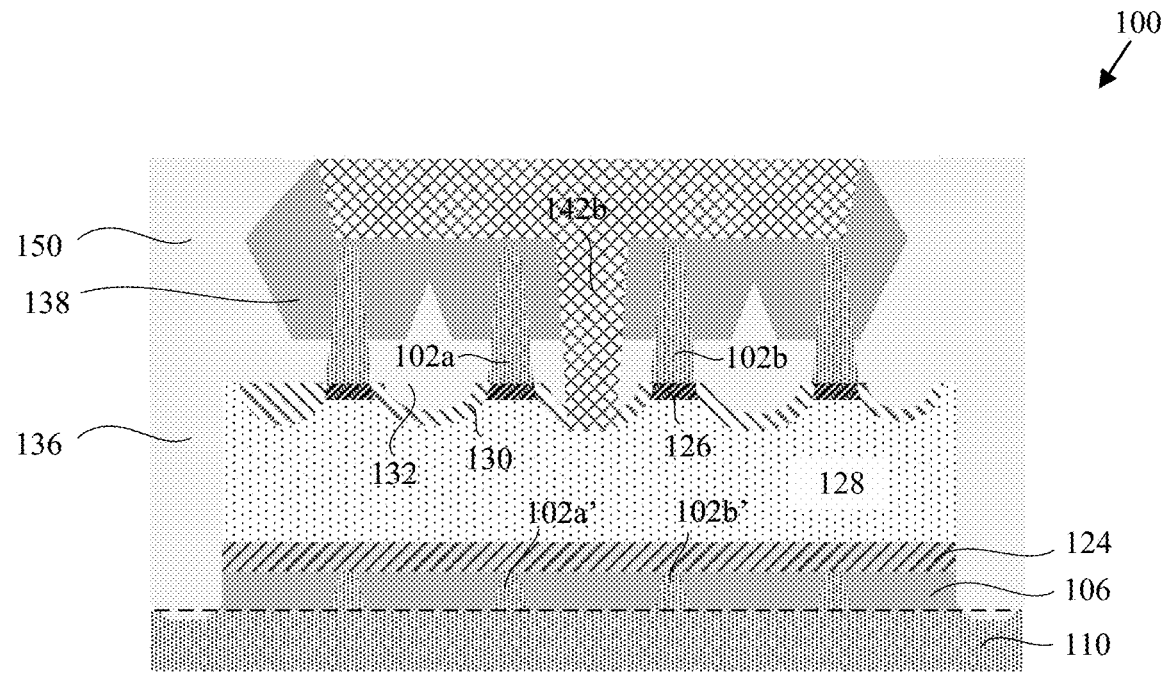
FIG. 11C is a cross-section view of the semiconductor device taken along section line X'-X" of FIG. 11A, according to an embodiment of the disclosure.

FIG. 11C is a cross-section view of the semiconductor device 100 taken along section line X'-X" of FIG. 11A, according to an embodiment of the disclosure. Referring to FIG. 11C, a contact 142b may be formed by etching the ILD material 150 to form an opening exposing the epitaxial structures 138. A portion of the exposed epitaxial structures 138 may subsequently be removed followed by removal of the ILD material 150, the second dielectric material 132 and the dielectric liner 130 to expose the metal structure 128. A contact metal may subsequently be deposited in the opening. The removal of the epitaxial structures 138 may be by wet etch or dry etch process.

Figure 11D:
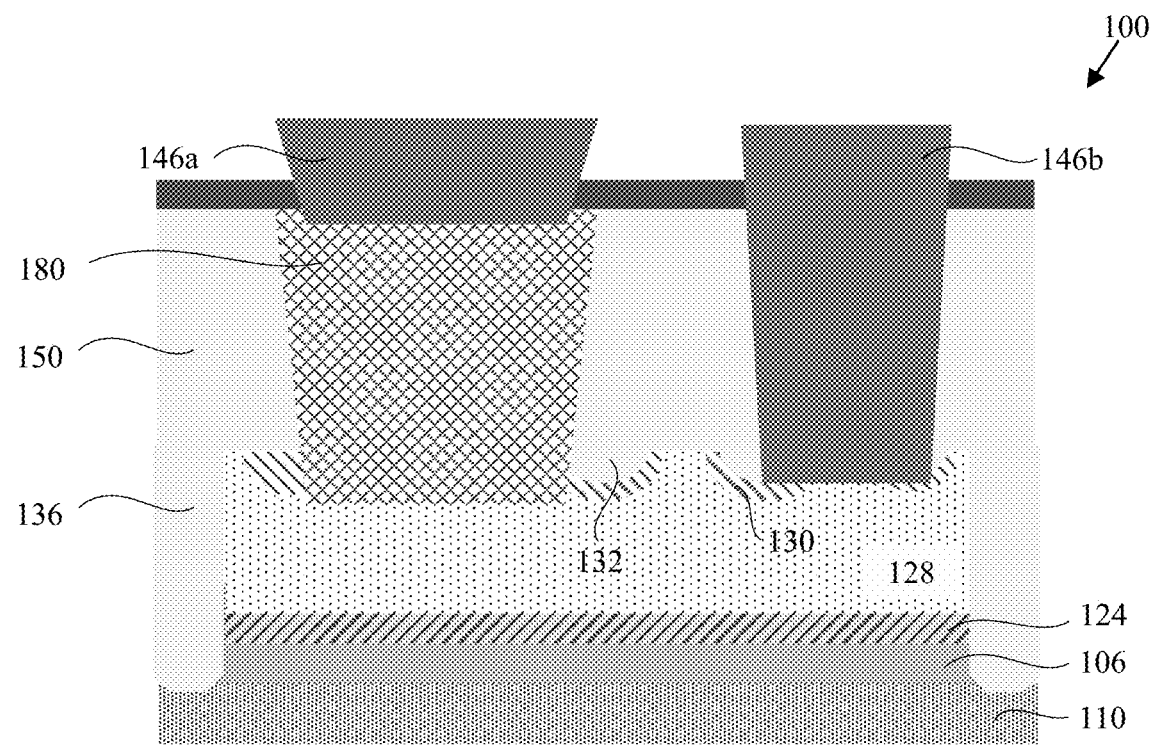
FIG. 11D is a cross-section view of the semiconductor device taken along section line Y-Y' of FIG. 11A, according to an embodiment of the disclosure.

FIG. 11D is a cross-section view of the semiconductor device 100 taken along section line Y-Y' of FIG. 11A, according to an embodiment of the disclosure. Referring to FIG. 11D, contact 146a may be disposed over a conductive trench silicide layer 180, the trench silicide layer 180 being disposed over the metal structure 128. Contact 146b extends from the metal structure 128 to an upper surface of the ILD material 150. Although not shown, the contacts 146a and 146b may be used to connect to upper metallization levels.

Figure 12:
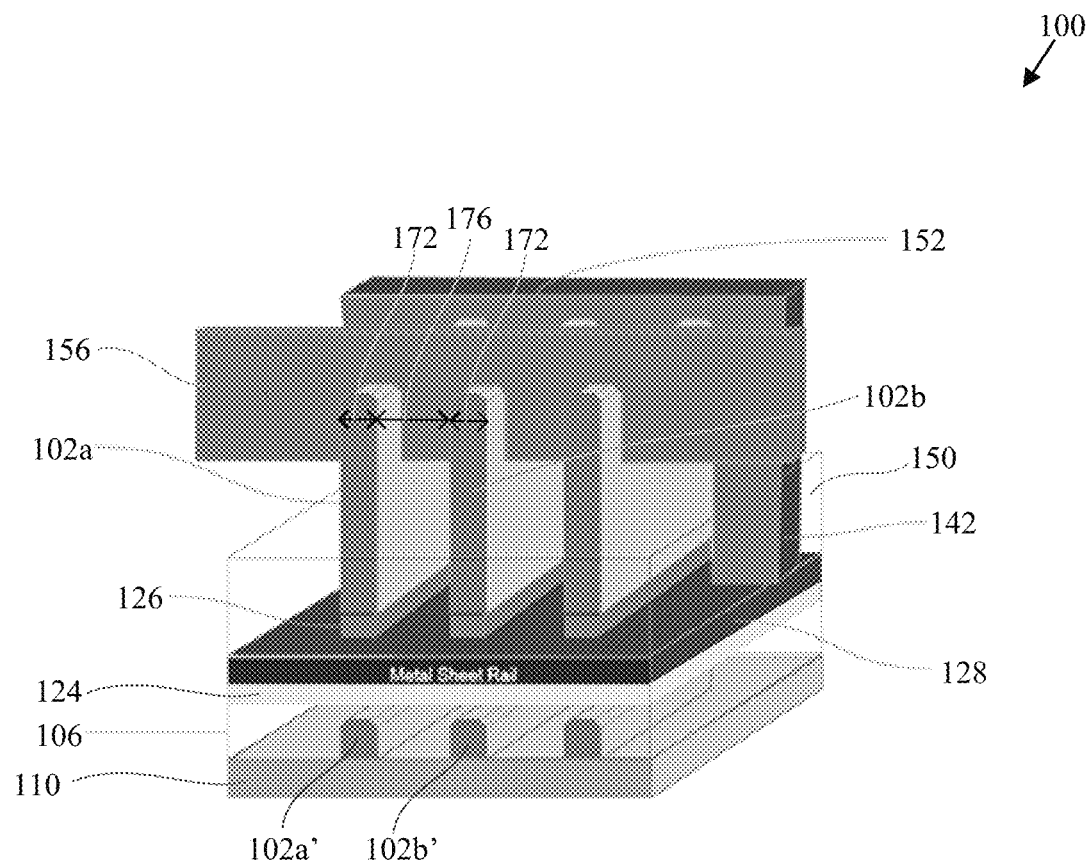
FIG. 12 is a three-dimensional view of the semiconductor device, according to an embodiment of the disclosure.

FIG. 12 is a three-dimensional view of the semiconductor device 100, according to an embodiment of the disclosure. Referring to FIG. 12, the semiconductor device 100 comprises a substrate 110 and an active layer over the substrate 110. The active layer comprises upper portions of the first and second semiconductor fins, 102a and 102b, respectively. Although not shown, epitaxial structures may be formed on the upper portions of the semiconductor fins 102a and 102b. The active layer may include the epitaxial structures disposed on the upper portions of the first and second semiconductor fins, 102a and 102b, respectively. The metal structure 128 is positioned between the active layer and the substrate 110. The metal structure 128 extends at least across the widths 172 of the first and second semiconductor fins, 102a and 102b, respectively, and the separation distance 176 between the fins 102a and 102b. The first isolation material 126 separates the metal structure 128 from the active layer. The second isolation material 124 separates the metal structure 128 from the substrate 110. In an embodiment, a contact 152 may be formed over the epitaxial structures on the semiconductor fins 102a and 102b. In an embodiment, a contact 142 may be formed to electrically connect the epitaxial structures to the metal structure 128.

Base portions 102a' and 102b' of the semiconductor fins, 102a and 102b, respectively, may be disposed on an upper surface of the substrate 110. The metal structure 128 may separate the upper portions of the semiconductor fins 102a and 102b from the base portions of the semiconductor fins, 102a' and 102b', respectively. The second isolation material 124 may separate the base portions 102a' and 102b' of the semiconductor fins, 102a and 102b, respectively from the metal structure 128.

Numerous advantages may be derived from the embodiments described above. As the metal structure 128 is positioned beneath the active layer, the length and the width of the metal structure 128 may be expanded for resistance optimization. The metal structure 128 is positioned between the substrate 110 and upper portions of the semiconductor fins 102a and 102b, therefore it does not lead to an increase in the semiconductor device 100 height. Placing the metal structure between the active layer and the substrate 110 instead of the BEOL metallization layers leads to improved pin access as well as signal routing between devices. As the metal structure is not placed in the BEOL metallization layers, the number of BEOL metallization stacks may be reduced resulting in a shorter semiconductor device 100 height. The metal structure 128 may also shield the active layer from electromagnetic radiation as well as injected light from the substrate side of the device.

The fabrication process flow shown in FIGS. 1 to 4 may be modified to create alternative embodiments within the scope of this disclosure. For example, FIGS. 13 to 15 illustrate a fabrication process flow to form a cavity over the substrate for subsequent deposition of a metal structure according to another embodiment of the disclosure. In an embodiment, the substrate may be a SOI layer. The same reference numbers used in FIGS. 1 to 4 are also used in FIGS. 13 to 15 for identical features.

Figure 13A:
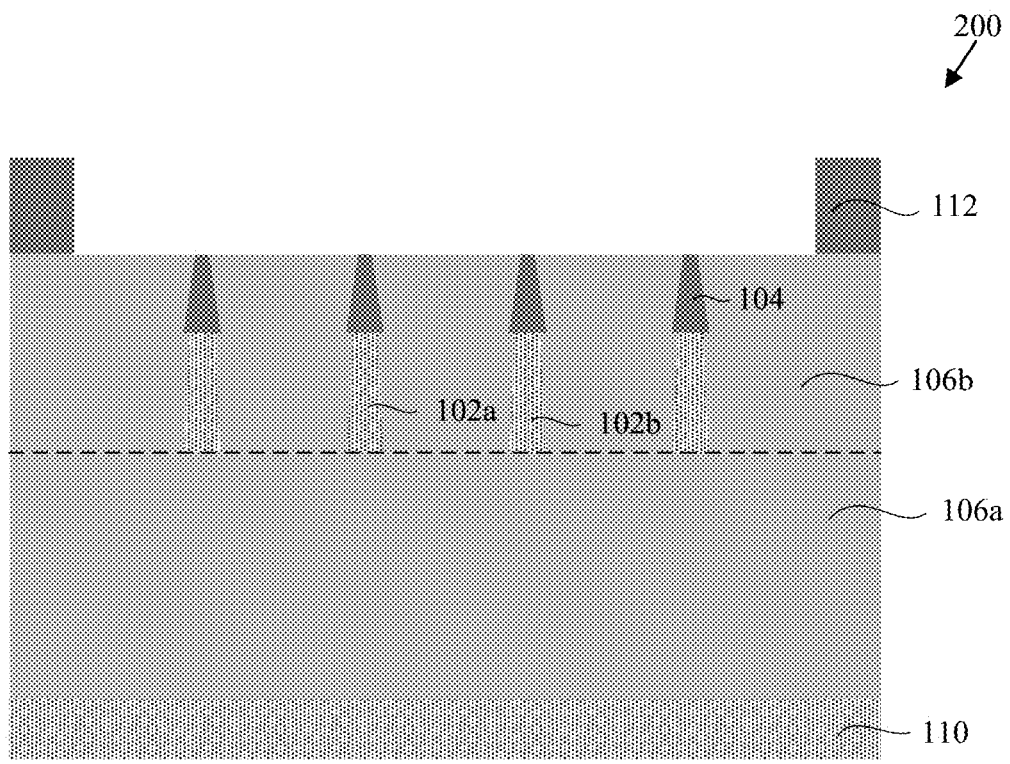
FIG. 13A is a cross-section view of a partially completed semiconductor device, according to another embodiment of the disclosure.
Figure 14:
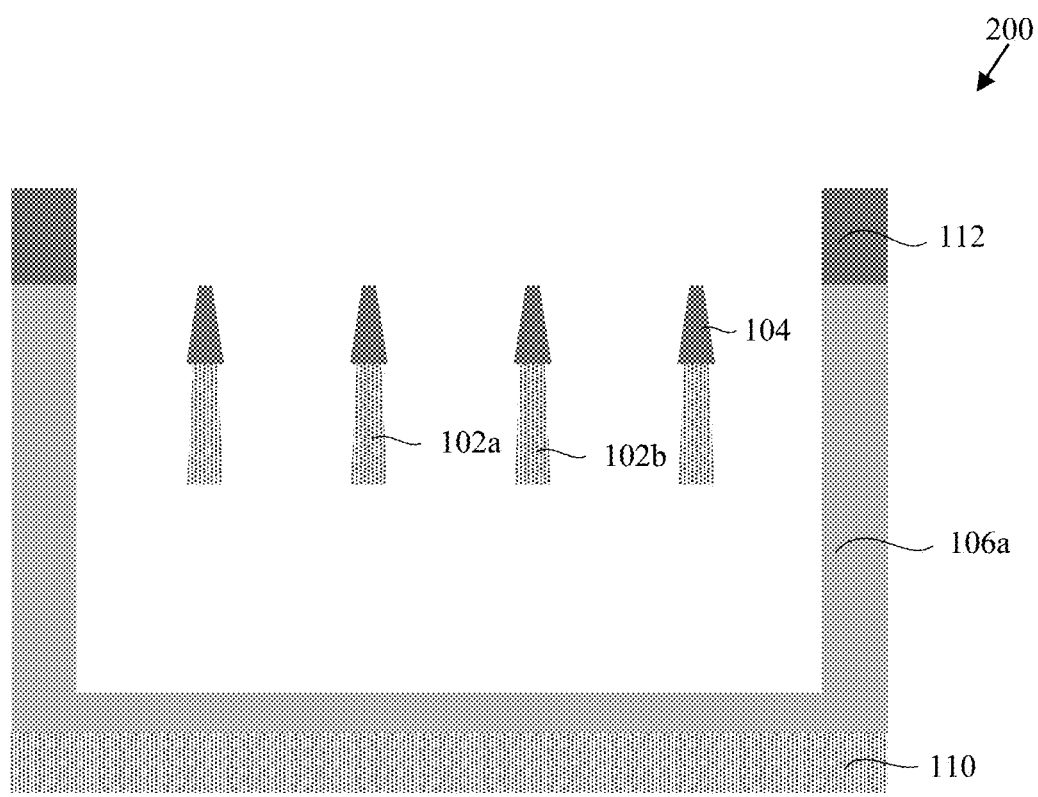
FIG. 14 is a cross-section view of a partially completed semiconductor device 200 after removal of the dielectric material 106, according to another embodiment of the disclosure.

FIG. 13A is a cross-section view of a partially completed semiconductor device 200, according to another embodiment of the disclosure. Referring to FIG. 13A, the semiconductor device 200 comprises a first semiconductor fin 102a and a second semiconductor fin 102b disposed over a substrate 110. In contrast to FIG. 2B, the semiconductor fins 102a and 102b are separated from the substrate 110 by a dielectric material 106a. The dielectric material 106a may be a bottom oxide layer of a SOI layer. A dielectric material 106b may be deposited over the semiconductor fins 102a and 102b and the dielectric material 106a followed by a planarization process such as CMP. The dielectric materials 106a and 106b may be collectively referred to as dielectric material 106. In an embodiment, the dielectric material 106 may be made of silicon dioxide. A nitride layer 112 may be deposited over the semiconductor fins 102a and 102b and the dielectric material 106b followed by patterning using a bottom isolation mask layer 120.

Figure 13B:
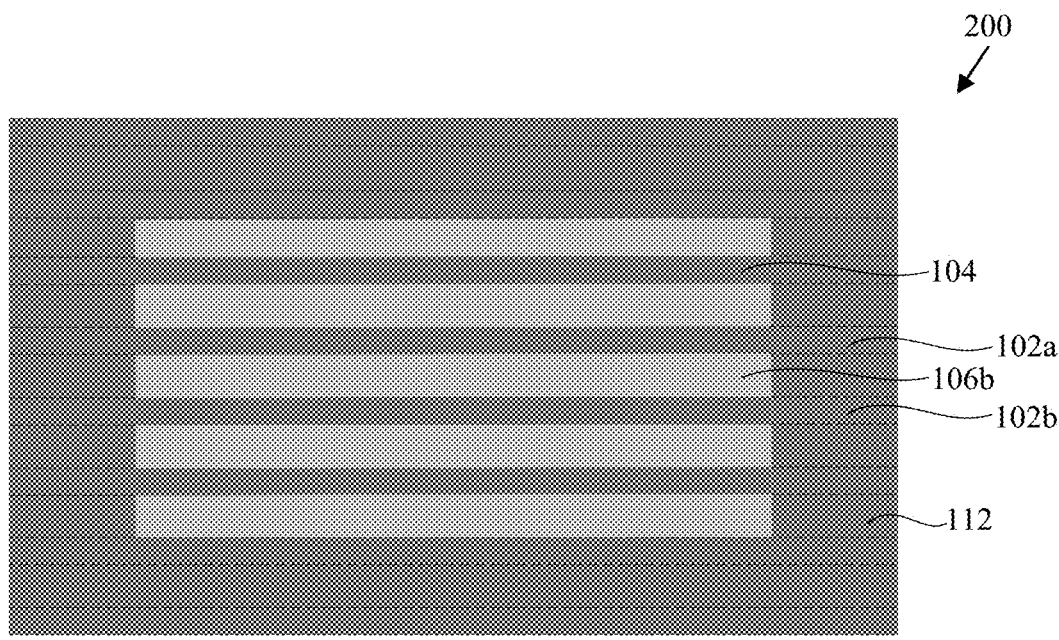
FIG. 13B is a corresponding top view of the partially completed semiconductor device shown in FIG. 13A.

FIG. 13B is a corresponding top view of the partially completed semiconductor device shown in FIG. 13A. Referring to FIG. 13B, the semiconductor fins 102a and 102b underneath the patterned nitride layer 112 are shown as dashed outlines.

FIG. 14 is a cross-section view of a partially completed semiconductor device 200 after removal of the dielectric material 106, according to another embodiment of the disclosure. Although not shown, the removal process forms a cavity in the dielectric material 106a between the semiconductor fins 102a and 102b and the substrate 110. The removal process may be by a wet or dry etch process.

Figure 15A:
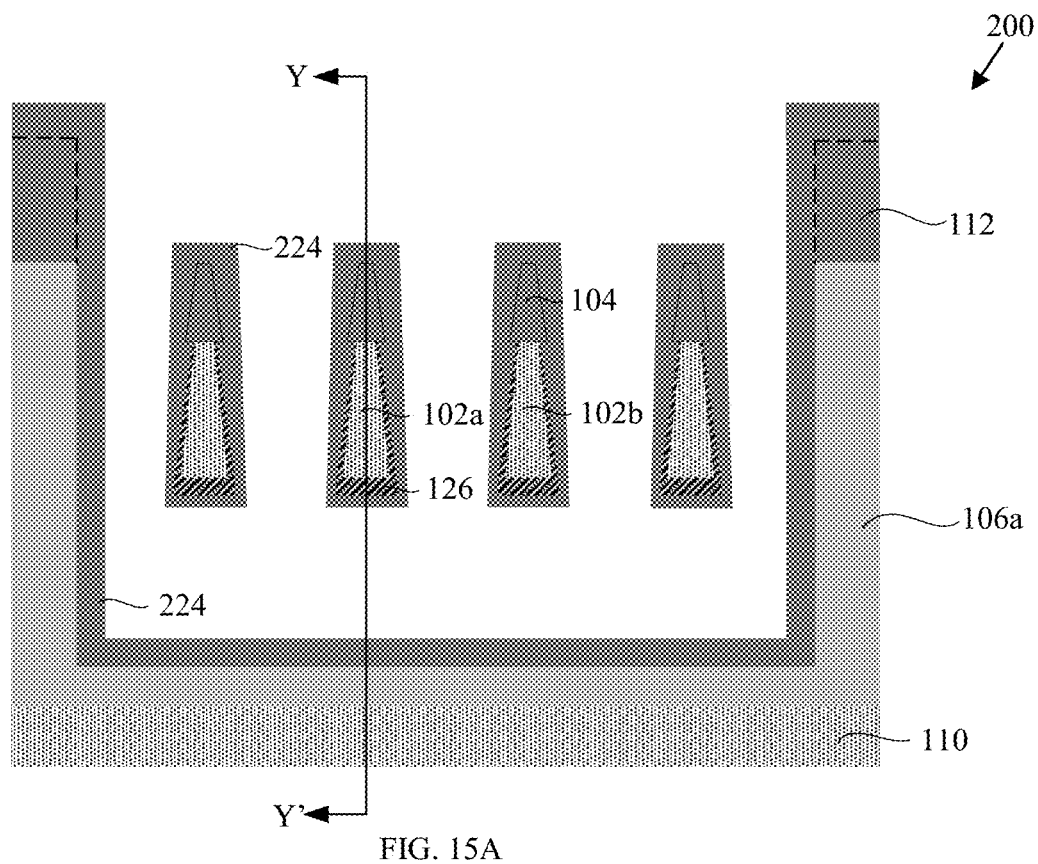
FIG. 15A is a cross-section view of a partially completed semiconductor device after formation of a first isolation material and a second isolation material, according to another embodiment of the disclosure.

FIG. 15A is a cross-section view of a partially completed semiconductor device 200 after formation of a first isolation material 126 and a second isolation material 224, according to another embodiment of the disclosure. The first isolation material 126 may be formed on bottom surfaces of the semiconductor fins 102a and 102b. The second isolation material 224 may be formed over the substrate 110. In an embodiment, the first isolation material 126 is made of silicon dioxide. The first isolation material 126 may be made by thermal oxidation or deposited by CVD, ALD or any other suitable methods. The second isolation material 224 may be made of silicon nitride. The second isolation material 224 may be deposited by CVD, ALD or any other suitable methods.

Figure 15B:
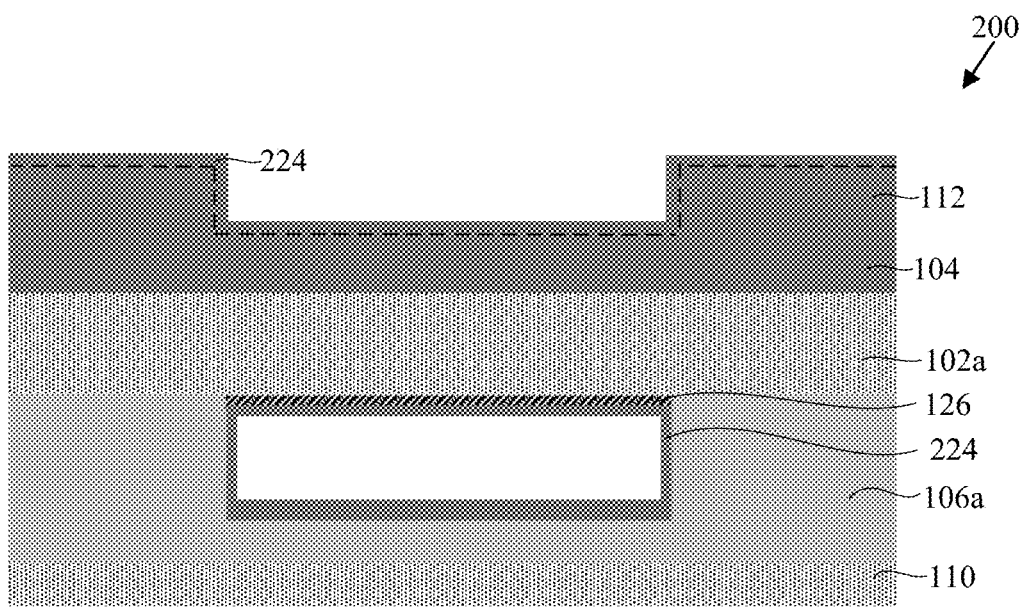
FIG. 15B is a corresponding cross-section view of the partially completed semiconductor device shown in FIG. 15A taken along section line Y-Y', according to another embodiment of the disclosure.

FIG. 15B is a corresponding cross-section view of the partially completed semiconductor device 200 shown in FIG. 15A taken along section line Y-Y', according to another embodiment of the disclosure. Referring to FIG. 15B, the first isolation material 126 is formed on the top surface of the cavity in the dielectric material 106a. The second isolation material 224 is formed on the bottom surface and sidewalls of the cavity in the dielectric material 106a. Subsequent process steps for the semiconductor device 200 fabrication are similar to the process flow for semiconductor device 100 shown in FIGS. 5 to 12.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:
1. A semiconductor device comprising:
a substrate;

a first semiconductor fin and a second semiconductor fin disposed over the substrate, the first and second semiconductor fins each having an upper portion;

epitaxial structures disposed over the upper portions of the first and second semiconductor fins, wherein the upper portions of the first and second semiconductor fins and the epitaxial structures provide an active layer;

a metal structure under the upper portions of the first and second semiconductor fins and above the substrate;

a first isolation material separating the metal structure from the active layer;

a second isolation material separating the metal structure from the substrate; and a first contact electrically connecting the metal structure to the epitaxial structures.

2. The semiconductor device of claim 1, wherein the metal structure is a continuous structure extending from under the first semiconductor fin to under the second semiconductor fin.

3. The semiconductor device of claim 2, further comprising a dielectric material over the active layer, and the metal structure.

4. The semiconductor device of claim 3, further comprising a second contact in the dielectric material extending from the metal structure to an upper surface of the dielectric material.

5. The semiconductor device of claim 1,
wherein base portions of the semiconductor fins are on an upper surface of the substrate; and
the metal structure separates the upper portions of the semiconductor fins from the base portions of the semiconductor fins.

6. The semiconductor device of claim 5, wherein the second isolation material separates the base portions of the semiconductor fins from the metal structure.

7. The semiconductor device of claim 1, wherein the metal structure comprises tungsten, ruthenium, titanium or titanium nitride.

8. The semiconductor device of claim 3 further comprising a dielectric liner separating the metal structure from the dielectric material.

9. A semiconductor device comprising:
a substrate;
a first semiconductor fin and a second semiconductor fin disposed over the substrate, the first and second semiconductor fins each having an upper portion and a width;
epitaxial structures disposed over the upper portions of the first and second semiconductor fins, wherein the upper portions of the first and second semiconductor fins and the epitaxial structures provide an active layer;
wherein the active layer has a length and a width;
a metal structure between the active layer and the substrate, having a length and a width, wherein the metal structure extends at least across the widths of the first and second semiconductor fins and a separation distance between the fins;
wherein the length of the metal structure is at least equal to the length of the active layer;
wherein the width of the metal structure is at least equal to the width of the active layer;
a first isolation material separating the metal structure from the active layer;
a second isolation material separating the metal structure from the substrate; and
a contact electrically connecting the metal structure to the epitaxial structures.

10. The semiconductor device of claim 9, wherein the length of the metal structure is larger than the length of the active layer.

11. The semiconductor device of claim 9, wherein the width of the metal structure is larger than the width of the active layer.

12. The semiconductor device of claim 9, wherein the semiconductor fins extend over the metal structure;
wherein the metal structure has sidewalls; and
a portion of the sidewall of the metal structure is covered by a lower portion of the semiconductor fins.

13. The semiconductor device of claim 12, wherein the first isolation material separates the portion of the sidewall of the metal structure from the lower portion of the semiconductor fins.

14. A method of fabricating a semiconductor device comprising:
providing a substrate with a first semiconductor fin and a second semiconductor fin over the substrate, the first and second semiconductor fins each having an upper portion;
forming a cavity in lower portions of the fins;
forming a first isolation material on a top surface of the cavity;
forming a second isolation material over the substrate;
forming a continuous metal structure over the second isolation material and between the first and second isolation materials, wherein the continuous metal structure is under the upper portions of the first and second semiconductor fins and above the substrate;
forming epitaxial structures on the semiconductor fins; and
forming a contact to electrically connect the epitaxial structures to the metal structure.

15. The method of claim 14, wherein the formation of a cavity in lower portions of the fins further comprises:
forming protective nitride caps on top surfaces of the semiconductor fins;
depositing a first dielectric layer over the substrate and the semiconductor fins;
depositing a nitride layer over the first dielectric layer and the nitride caps;
forming a bottom isolation masking layer to cover a portion of the nitride layer;
removing an uncovered portion of the nitride layer and upper portions of the first dielectric layer under the removed nitride layer to expose upper portions of the semiconductor fins;
removing the bottom isolation masking layer from the nitride layer;
forming dielectric spacers on the exposed upper portions of the semiconductor fins;
removing lower portions of the first dielectric layer from lower portions of the semiconductor fins to expose the lower portions of the semiconductor fins;
etching the exposed lower portions of the semiconductor fins to form a cavity in the lower portions of the semiconductor fins.

16. The method of claim 15, wherein the formation of a first isolation material on a top surface of the cavity further comprises:
growing an oxide layer on a top surface of the cavity.

17. The method of claim 14, wherein the formation of a continuous metal structure over the second isolation material and between the first and second isolation materials further comprises:

depositing a layer of metal over the second isolation material, between the first and second isolation materials and over upper portions of the semiconductor fins;

removing the metal layer from the upper portions of the semiconductor fins to form a continuous metal structure over the second isolation material and between the first and second isolation materials.

18. The method of claim 15 further comprising:

depositing a dielectric liner over the metal structure and the upper portions of the semiconductor fins;

forming a second dielectric layer over the dielectric liner;

removing the nitride layer from the first dielectric layer and the nitride caps to expose the first dielectric layer and the nitride caps;

forming an active region masking layer to cover the upper portions of the semiconductor fins over the metal structure and the second dielectric layer;

etching uncovered portions of the semiconductor fins to define an active layer and etching the first dielectric layer;

removing the active region masking layer;

forming a third dielectric layer over etched portions of the first dielectric layer and over etched portions of the semiconductor fins; and etching the second dielectric layer, the dielectric liner, the dielectric spacers and the nitride caps to expose the upper portions of the fins.

19. The method of claim 18, wherein the formation of epitaxial structures on the semiconductor fins further comprises:

forming epitaxial structures on the exposed upper portions of the fins.

20. The method of claim 18, wherein the formation of a contact to electrically connect the epitaxial structures to the metal structure further comprises:

forming an interlayer dielectric over the etched second dielectric layer, the semiconductor fins and the epitaxial structures;

forming an opening in the interlayer dielectric over the epitaxial structures, the second dielectric layer and the dielectric liner to expose a portion of the metal structure and the epitaxial structures; and depositing a metal layer in the opening to form a contact.

* * * * *